US009064935B2

(12) United States Patent
Tang et al.

(10) Patent No.: US 9,064,935 B2
(45) Date of Patent: Jun. 23, 2015

(54) METHODS OF FORMING A PLURALITY OF CONDUCTIVE LINES IN THE FABRICATION OF INTEGRATED CIRCUITRY, METHODS OF FORMING AN ARRAY OF CONDUCTIVE LINES, AND INTEGRATED CIRCUITRY

(75) Inventors: Sanh Tang, Boise, ID (US); Ming Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 786 days.

(21) Appl. No.: 13/182,293

(22) Filed: Jul. 13, 2011

(65) Prior Publication Data

US 2011/0266689 A1 Nov. 3, 2011

Related U.S. Application Data

(62) Division of application No. 12/436,262, filed on May 6, 2009, now Pat. No. 7,989,336.

(51) Int. Cl.
*H01L 23/48* (2006.01)
*H01L 21/768* (2006.01)

(52) U.S. Cl.
CPC ...... *H01L 21/76877* (2013.01); *H01L 21/7682* (2013.01); *H01L 21/76838* (2013.01); *H01L 21/76883* (2013.01); *H01L 2924/0002* (2013.01)

(58) Field of Classification Search
CPC ......... H01L 23/48; H01L 29/76; H01L 29/40; H01L 23/52; H01L 21/336
USPC ........................... 257/773, 758, 276, 522, 390
See application file for complete search history.

(56) References Cited

U.S. PATENT DOCUMENTS

| 5,641,712 | A | * | 6/1997 | Grivna et al. | 438/624 |
| 5,924,006 | A | * | 7/1999 | Lur et al. | 438/626 |
| 6,022,802 | A | * | 2/2000 | Jang | 438/656 |
| 6,274,477 | B1 | * | 8/2001 | Hong | 438/624 |
| 6,562,695 | B1 | | 5/2003 | Suzuki et al. | |
| 6,599,825 | B2 | | 7/2003 | Park | |

(Continued)

FOREIGN PATENT DOCUMENTS

| CN | 101371339 | 2/2009 |
| CN | 201080019969.3 | 7/2013 |

(Continued)

OTHER PUBLICATIONS

Stich et al., "Integrated of air gaps based on selective ozone/TEOS deposition into a multi layer metallization scheme", IEEE, 2006, pp. 134-136.

*Primary Examiner* — Chuong A Luu
(74) *Attorney, Agent, or Firm* — Wells St. John, P.S.

(57) ABSTRACT

A method of forming a pair of conductive lines in the fabrication of integrated circuitry includes forming a trench into a damascene material received over a substrate. Conductive material is deposited over the damascene material and to within the trench to overfill the trench. The conductive material is removed back at least to the damascene material to leave at least some of the conductive material remaining in the trench. Etching is conducted longitudinally through the conductive material within the trench to form first and second conductive lines within the trench which are mirror images of one another in lateral cross section along at least a majority of length of the first and second conductive lines. Other implementations are contemplated.

13 Claims, 26 Drawing Sheets

(56) References Cited

U.S. PATENT DOCUMENTS

| | | |
|---|---|---|
| 6,627,549 B2 * | 9/2003 | Juengling .................... 438/689 |
| 7,094,669 B2 | 8/2006 | Bu et al. |
| 7,253,118 B2 | 8/2007 | Tran et al. |
| 7,604,926 B2 | 10/2009 | Kamigaki et al. |
| 7,723,227 B1 * | 5/2010 | Bian ............................ 438/623 |
| 2003/0119294 A1 | 6/2003 | Park |
| 2003/0146513 A1 * | 8/2003 | Ireland ........................ 257/758 |
| 2004/0232496 A1 * | 11/2004 | Chen et al. ................... 257/390 |
| 2004/0232552 A1 * | 11/2004 | Wang et al. ................... 257/758 |
| 2006/0234165 A1 | 10/2006 | Kamigaki et al. |
| 2006/0249482 A1 | 11/2006 | Wrschka et al. |
| 2007/0261016 A1 | 11/2007 | Sandhu et al. |
| 2008/0200026 A1 * | 8/2008 | Koh et al. .................... 438/643 |
| 2009/0017634 A1 | 1/2009 | Figura et al. |

FOREIGN PATENT DOCUMENTS

| | | |
|---|---|---|
| JP | 63-086451 | 4/1988 |
| JP | 63-293859 | 11/1988 |
| JP | 2006-303022 | 11/2006 |
| KR | 10-0310257 | 9/2001 |
| KR | 2002-0047523 | 6/2002 |
| KR | 2003-0051019 | 6/2003 |
| TW | 099112702 | 1/2014 |
| WO | WO 2004/101222 | 11/2004 |
| WO | PCT/US2010/030583 | 10/2010 |
| WO | PCT/US2010/030583 | 11/2011 |

* cited by examiner

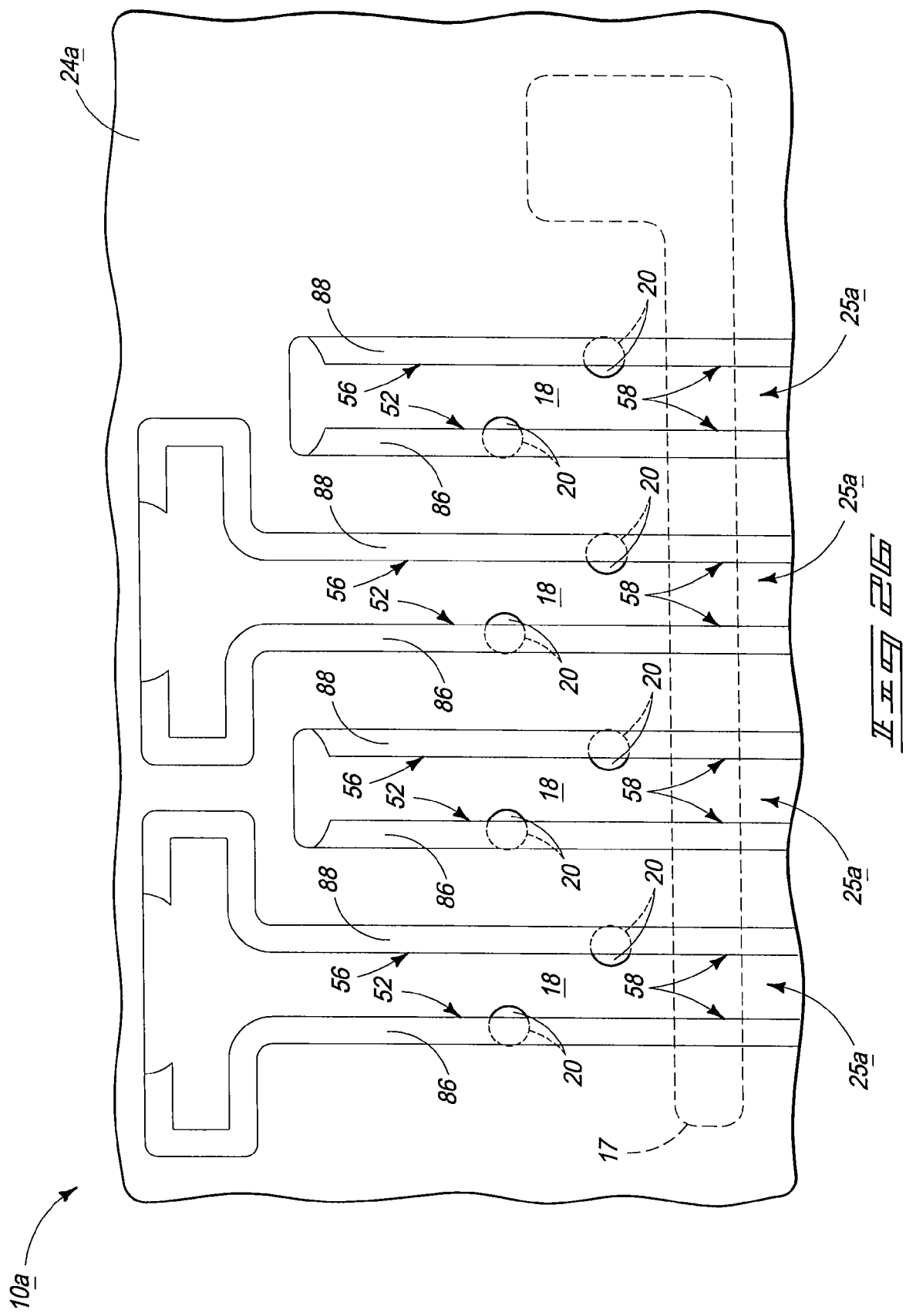

METHODS OF FORMING A PLURALITY OF CONDUCTIVE LINES IN THE FABRICATION OF INTEGRATED CIRCUITRY, METHODS OF FORMING AN ARRAY OF CONDUCTIVE LINES, AND INTEGRATED CIRCUITRY

RELATED PATENT DATA

This patent resulted from a divisional application of U.S. patent application Ser. No. 12/436,262, filed May 6, 2009 now U.S. Pat. No. 7,989,336, entitled "Methods Of Forming A Plurality Of Conductive Lines In The Fabrication Of Integrated Circuitry, Methods Of Forming An Array Of Conductive Lines, And Integrated Circuitry", naming Sanh Tang and Ming Zhang as inventors, the disclosure of which is incorporated by reference.

TECHNICAL FIELD

Embodiments disclosed herein pertain to methods of forming a plurality of conductive lines in the fabrication of integrated circuitry, to methods of forming an array of conductive lines, and to integrated circuitry independent of method of fabrication.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized.

The continual reduction in feature sizes places ever greater demands on the techniques used to form the features. For example, photolithography is commonly used to form patterned features, such as conductive lines. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing spacer-forming layers to have a lateral thickness which is less than that of the minimum capable photolithographic feature size. The spacer-forming layers are commonly anisotropically etched to form sub-lithographic features, and then the features which were formed at the minimum photolithographic feature size are etched from the substrate. Using such technique where pitch is actually halved, such reduction in pitch is conventionally referred to as pitch "doubling". More generally, "pitch multiplication" encompasses increase in pitch of two or more times and also of fractional values other than integers. Thus, conventionally, "multiplication" of pitch by a certain factor actually involves reducing the pitch by that factor.

Conductive lines may be used in integrated circuitry as electrical interconnects and as bit lines in memory circuitry. Metals, whether elemental metals, alloys of different elemental metals, or conductive metal compounds, are dominant interconnect material due to their high electrical conductivity. One manner of forming conductive lines uses what is referred to as damascene processing. In such, a suitable molding material is formed over a substrate over which the conductive lines are to be formed. Trenches are etched into the molding material into desired shapes and orientations of the conductive lines being formed. The trenches are at least partially filled with conductive material in forming conductive lines within the trenches.

It is difficult to fill very narrow trenches in damascene formation of conductive lines, particularly as the width of such lines has fallen to 20 nanometers and below using pitch multiplication techniques because of resistivity requirements. Effective resistivity of the trench fill material increases at these dimensions. Additionally, voids may form within the conductive material within the trenches due to the material not spanning completely across the trench width. Voids inherently reduce the volume of conductive material in the line. Such has not been particularly problematic at trench/line widths of at least 60 nanometers.

While the invention was motivated in addressing the above-identified issues, the invention is no way so limited.

BRIEF DESCRIPTION OF THE DRAWINGS

FIG. 26 is a top plan view of the FIG. 24 substrate at a processing step subsequent to that shown by FIGS. 24 and 25.

DETAILED DESCRIPTION OF EXAMPLE EMBODIMENTS

Figure 1:
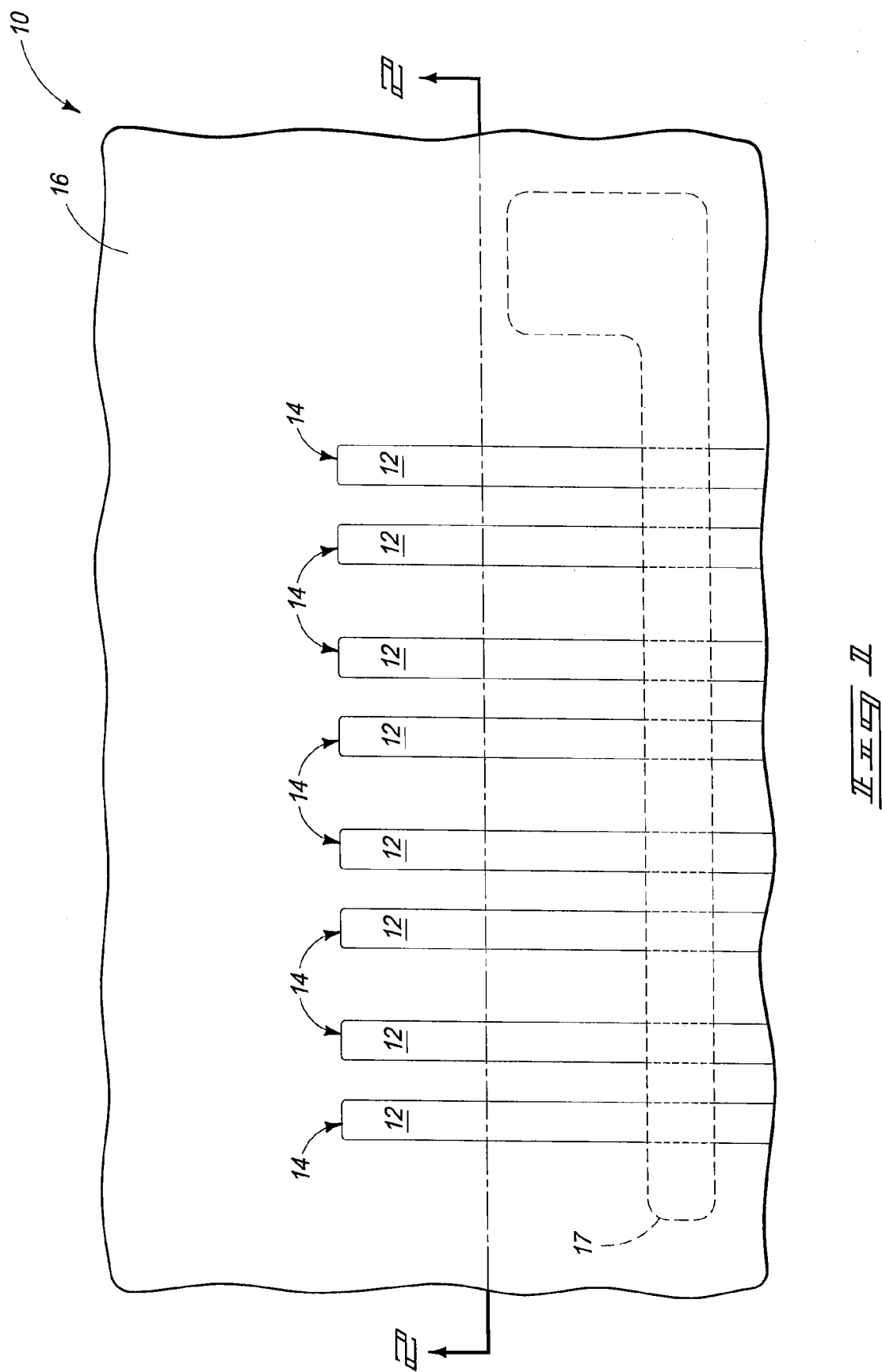
FIG. 1 is a diagrammatic top plan view of a substrate in process in accordance with an embodiment of the invention.
Figure 2:
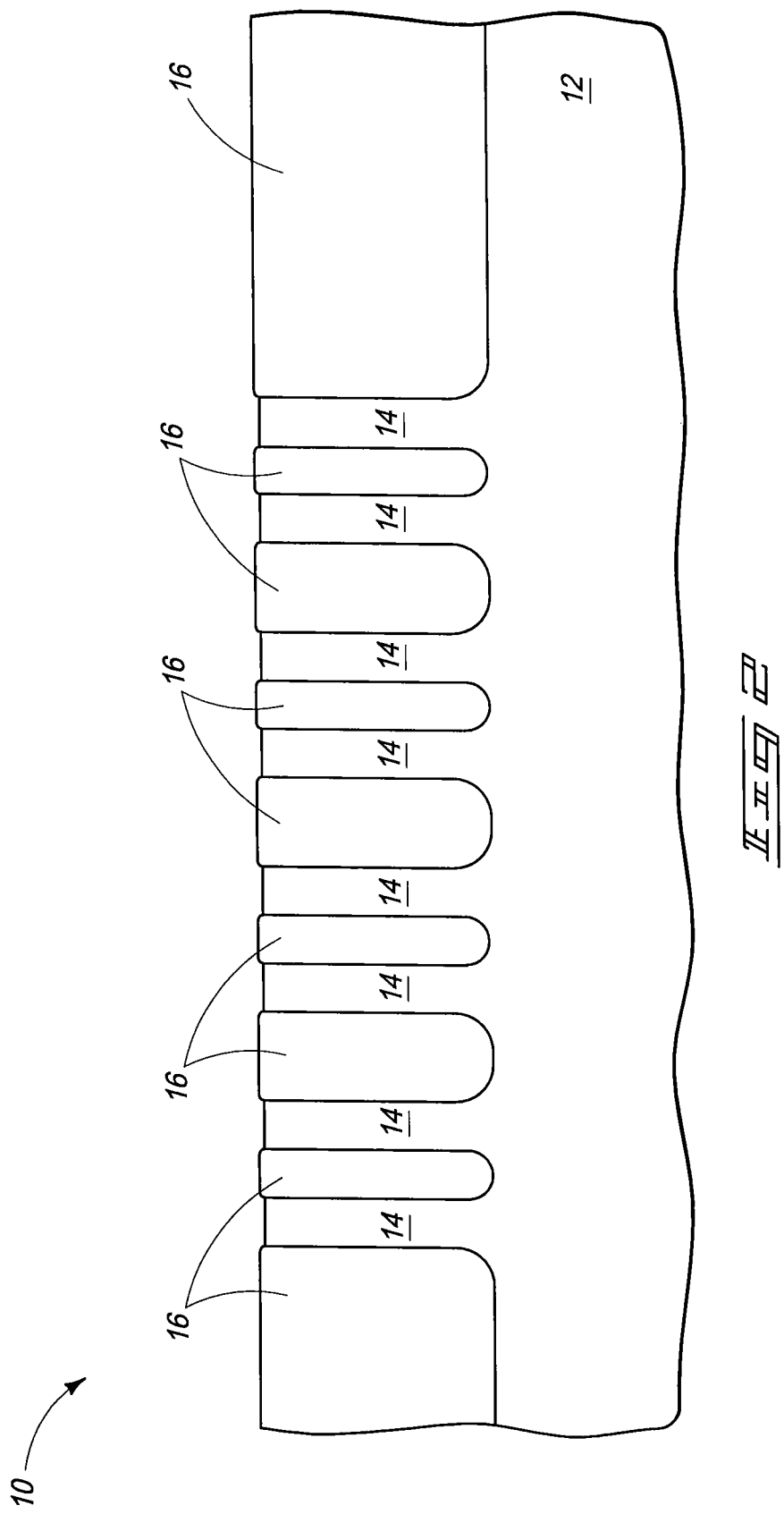
FIG. 2 is a cross section taken through line 2-2 in FIG. 1.

Example embodiment methods of forming a plurality of conductive lines in the fabrication of integrated circuitry are described with reference to FIGS. 1-17. Referring to FIGS. 1 and 2, a substrate fragment, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 includes a bulk semiconductor substrate 12, for example monocrystalline silicon. Trench isolation 16 (i.e., one or both of silicon dioxide and silicon nitride) has been formed within bulk substrate 12 to define lines, rows, or columns of active area 14 of material 12. Semiconductor-on-insulator processing might alternately or additionally be employed, and whether existing or yet-to-be developed. Lines of active area 14 might be equal or different in width, and regardless might be equally spaced from immediately adjacent lines of active area. An example transistor gate construction 17 has been formed orthogonally relative to the longitudinal orientation of active areas 14. Such may comprise a field effect transistor gate construction and may or may not include charge storage regions, for example, in the fabrication of programmable erasable transistor gates having floating gate regions.

Figure 3:
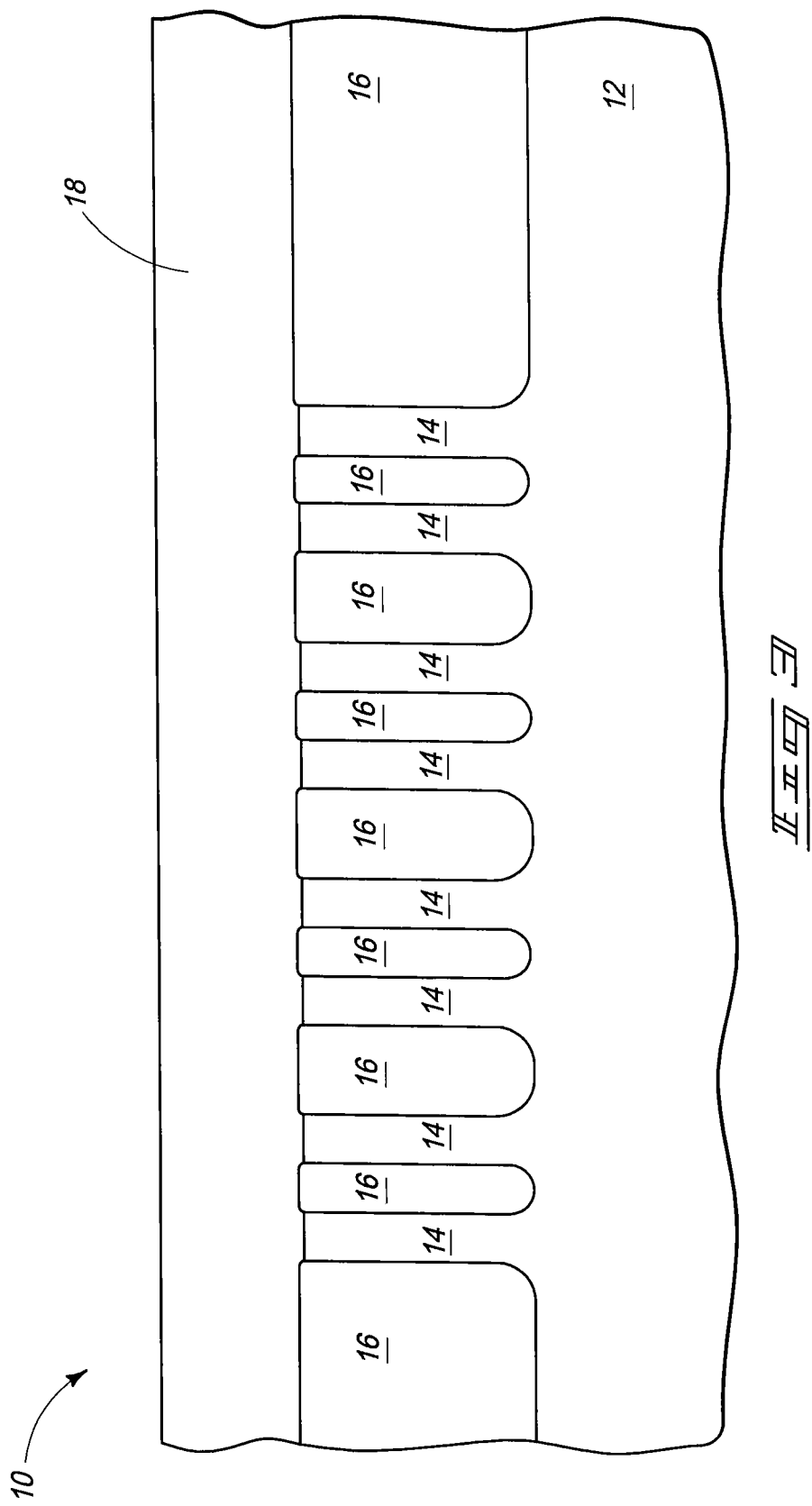
FIG. 3 is a view of the FIG. 2 substrate at a processing step subsequent to that shown by FIGS. 1 and 2.

Referring to FIG. 3, insulative material 18 has been formed over underlying substrate material. Such may be homogenous or non-homogenous, with doped or undoped silicon dioxide and silicon nitride being examples.

Figure 4:
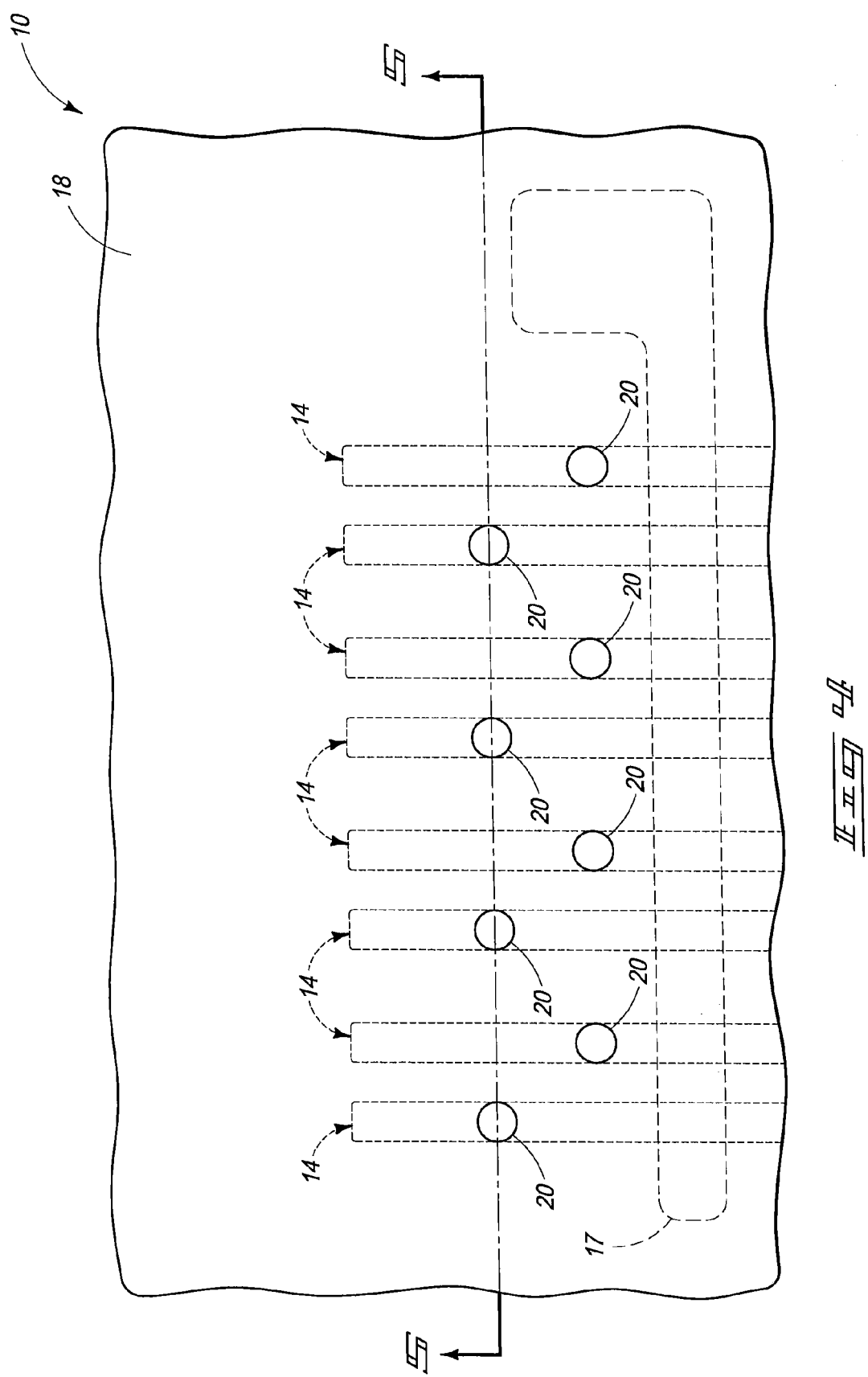
FIG. 4 is a top plan view of the FIG. 1 substrate at a processing step subsequent to that shown by FIG. 3.
Figure 5:
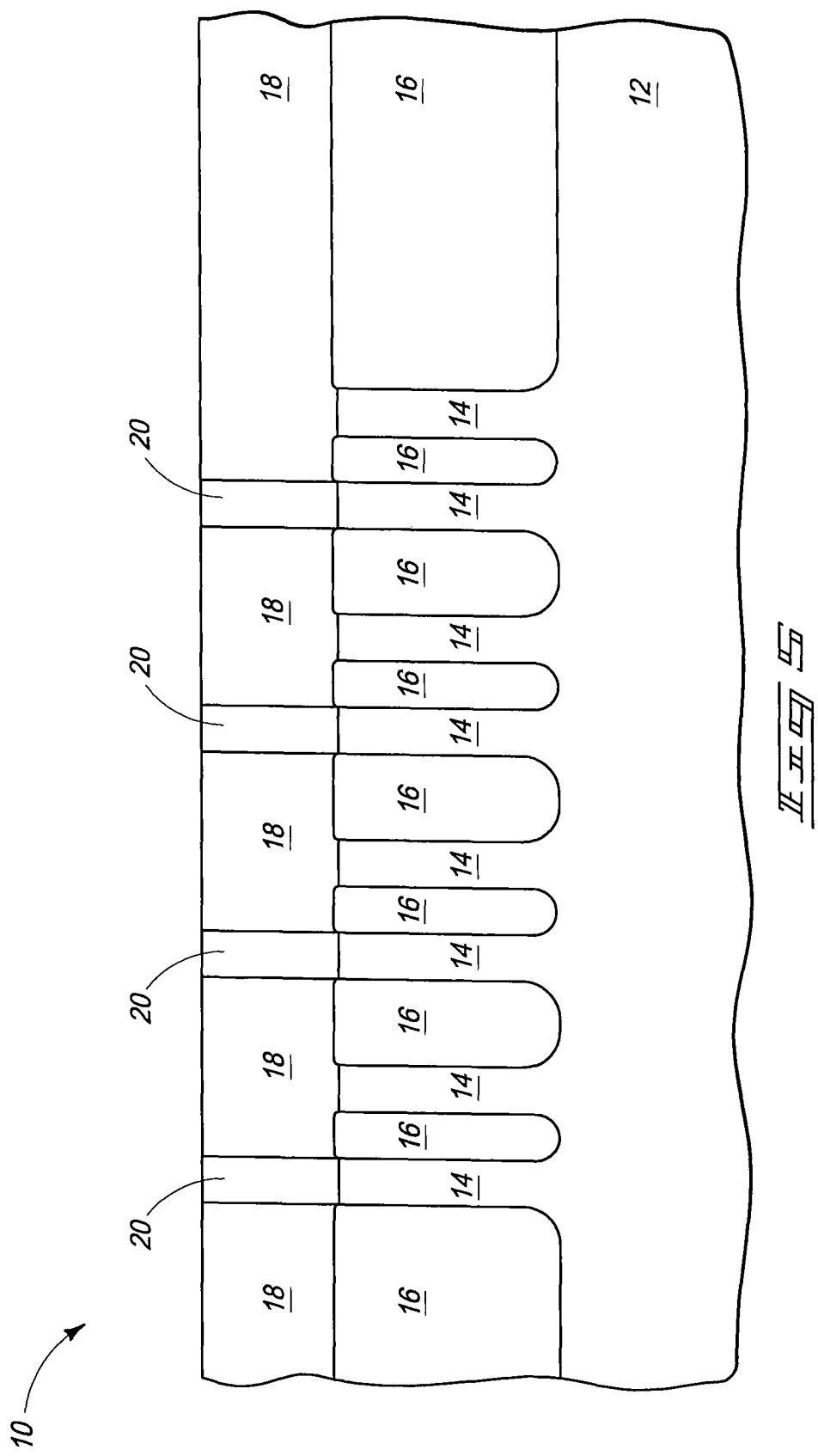
FIG. 5 is a cross section taken through line 5-5 in FIG. 4.

Referring to FIGS. 4 and 5, an array of contact openings has been formed through insulative layer 18 to regions of active area 14. Such have been filled with conductive material 20. By way of example, such might be formed by photolithography and anisotropic etch, followed by deposition of conductive material 20, and followed by planarization back of conductive material 20 at least to an outermost surface of insulative material 18. Conductive material 20 may be homogenous or non-homogenous, with conductively doped polysilicon, elemental metals, alloys of elemental metals, and conductive metal compounds being examples. Elemental tungsten with or without one or more conductive barrier layers are examples. FIGS. 4 and 5 show but one example substrate over which a plurality of conductive lines may be fabricated in accordance with example embodiments of the invention. Any other substrate, whether existing or yet-to-be developed, may be used.

Figure 6:
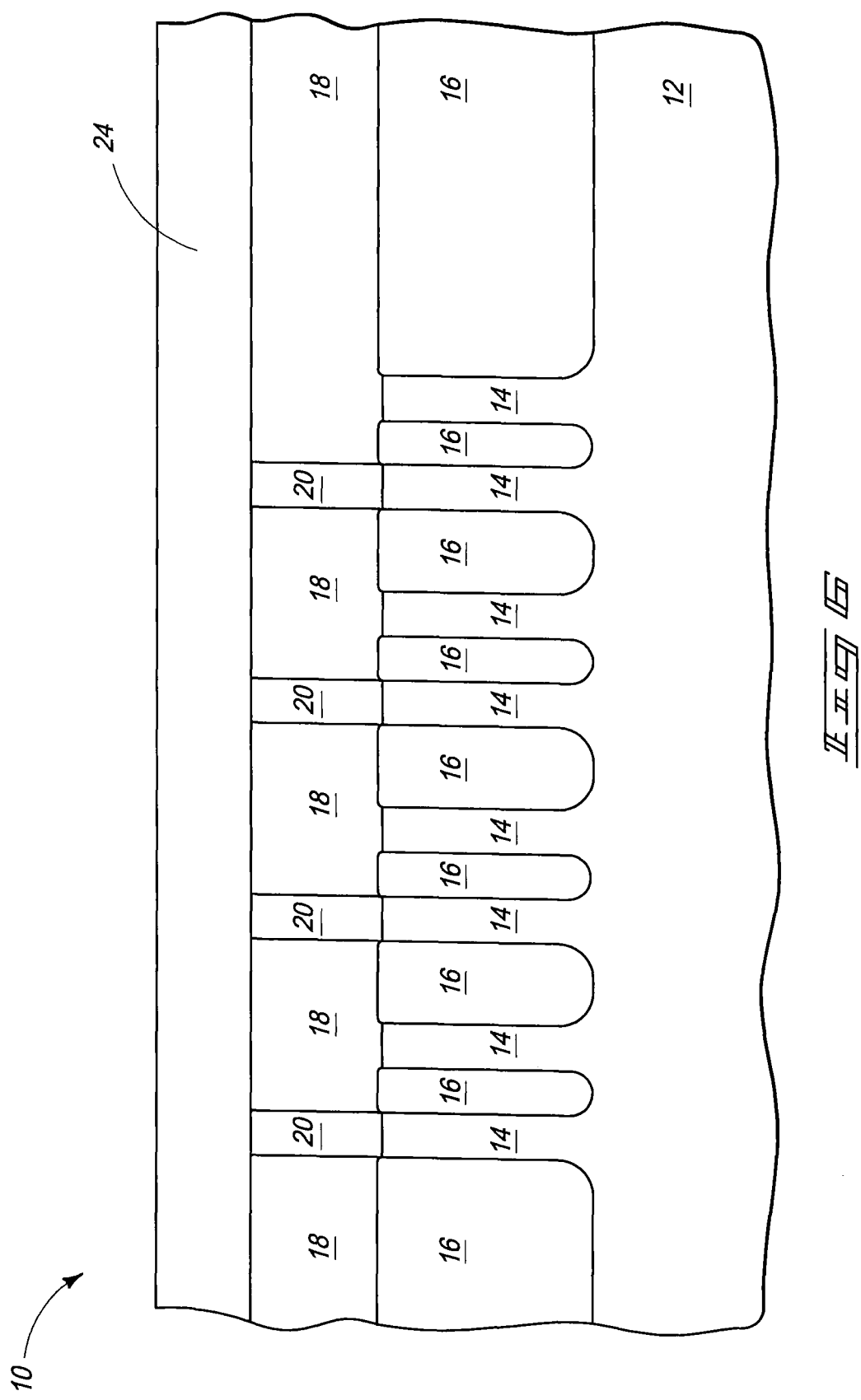
FIG. 6 is a view of the FIG. 5 substrate at a processing step subsequent to that shown by FIGS. 4 and 5.

Referring to FIG. 6, a damascene material has been deposited as part of substrate 10. In the context of this document, a "damascene material" is any material whether existing or yet-to-be developed which is used to make conductive interconnect lines in damascene-like manners. Such encompass forming trenches partially or fully through the damascene material in the shape of desired circuitry conductive interconnecting lines. Conductive material is subsequently deposited into the line trenches, followed by optional removal of excess conductive material and of some or all of the damascene material. Subtractive patterning of conductive material received outwardly of the damascene material might alternately or additionally occur.

Damascene material 24 may be any of insulative, semiconductive, or conductive, including any combinations thereof. Example insulative compositions for damascene material 24 include silicon dioxide and silicon nitride, and whether doped or undoped. Example semiconductive materials include semiconductively doped monocrystalline silicon and polycrystalline silicon. Example conductive materials include conductively doped semiconductive materials, conductive elemental metals, conductive metal compounds, and alloys of conductive elemental metals. Damascene material 24 may be of any suitable thickness, with from 100 Angstroms to 1 micron being an example range. Such may or may not have a planar outermost surface, and such may or may not in whole or in part remain as part of the finished integrated circuitry construction. In one ideal embodiment, such is insulative and largely remains as part of the finished integrated circuitry construction, as will be apparent from the continuing discussion.

Figure 7:
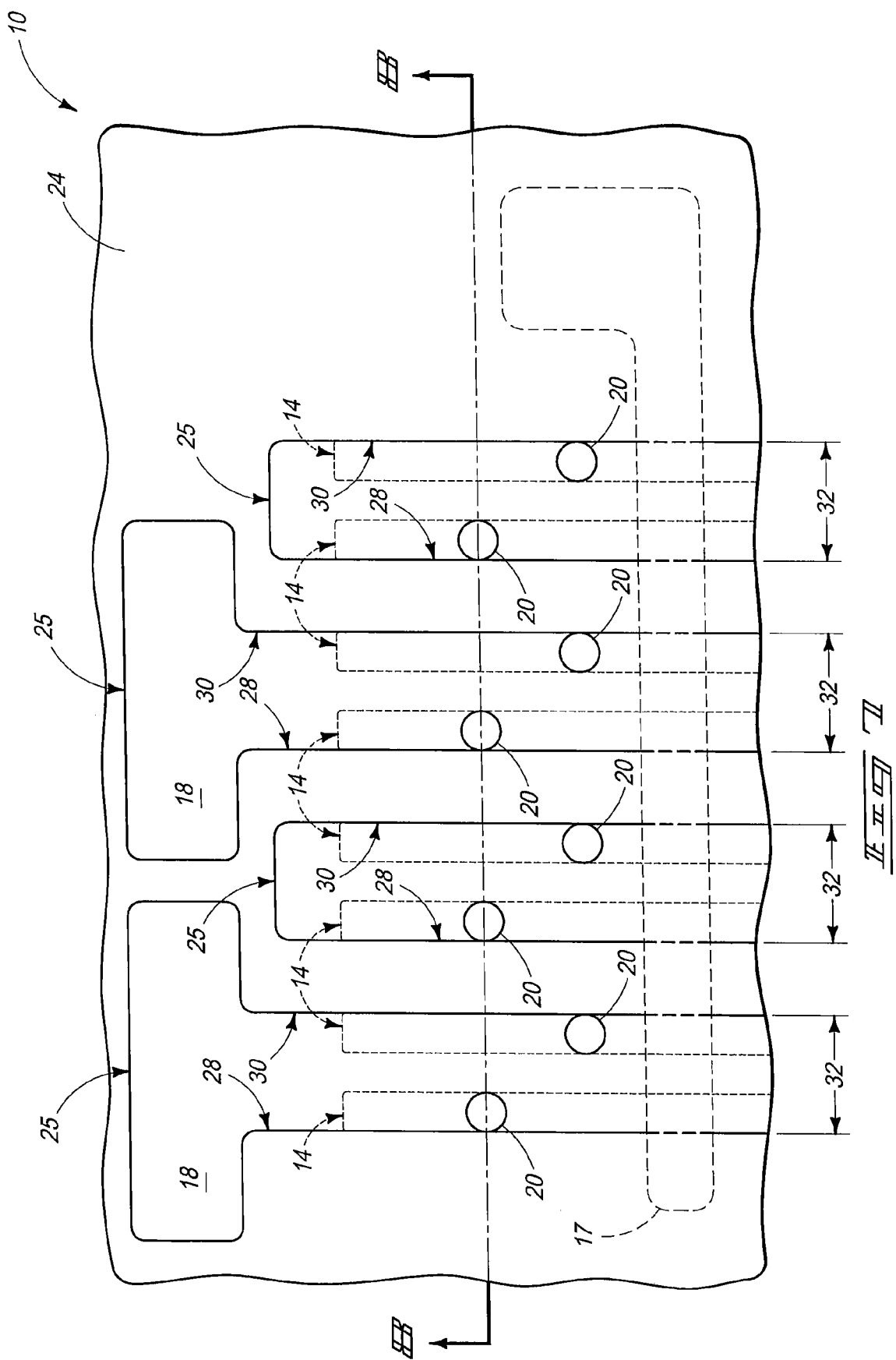
FIG. 7 is a top plan view of the FIG. 4 substrate at a processing step subsequent to that shown by FIG. 6.
Figure 8:
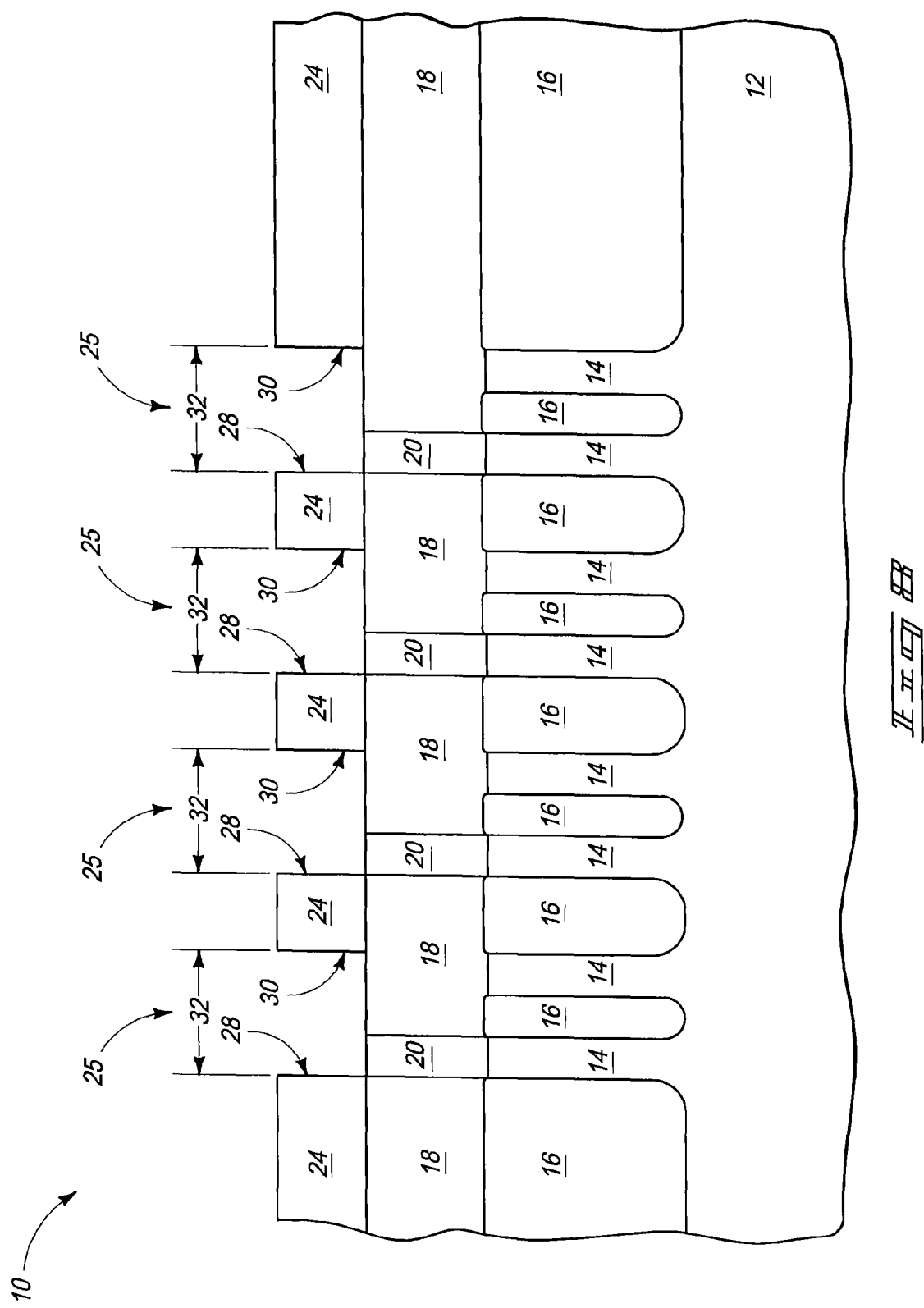
FIG. 8 is a cross section taken through line 8-8 in FIG. 7.

Referring to FIGS. 7 and 8, at least one trench 25 has been formed into damascene material 24. FIGS. 7 and 8 show a plurality of trenches 25 having been formed, and which are oriented parallel one another and largely of common overall shape. However in some embodiments, only a single trench may be fabricated, and if more than one trench is fabricated, each need not be of common shape nor spacing relative to one another. Trenches 25 may be formed by any existing or yet-to-be developed techniques, with photolithography and subsequent subtractive etching being an example. In one embodiment and as shown, trenches 25 extend completely though damascene material 24.

An example trench 25 may be considered as having first and second opposing trench sidewalls 28 and 30. First trench sidewall 28 is longitudinally elongated to comprise a longitudinal contour of a first sidewall of one of a plurality of conductive lines being formed, as will become apparent in the continuing discussion. Likewise, second trench sidewall 30 is longitudinally elongated to comprise a longitudinal contour of a first sidewall of another of the plurality of conductive lines being formed, as also will be apparent in the continuing discussion.

Reference to "first" and "second" herein is for ease and clarity in description, with such references of course being reversible. For example, first trench sidewall 28 is shown as being the left sidewall in the figures, while second sidewall 30 is represented as being the right sidewall in the figures. Such might of course be reversed. Regardless, such trench sidewalls will be used at least in part to define longitudinal contours of different conductive lines which are spaced relative to one another at least in the depicted FIG. 8 cross section.

Two or more conductive lines may be fabricated relative to each trench. In one embodiment, only two conductive lines are formed with respect to each trench. Regardless, in one embodiment, trenches 25 may be considered as having a minimum width 32 between sidewalls 28 and 30 which is at least about 3 $W_m$, where $W_m$ is the minimum width of the conductive lines being formed with respect to each trench. In the context of this document, use of "about" requires plus or minus 10 percent of the stated dimension. In one embodiment, trench minimum width 32 is equal to about 3 $W_m$, and in one embodiment equal to 3 $W_m$.

The integrated circuitry being formed may be fabricated with or without photolithography. Further, if using photolithography, $W_m$ may be at a minimum photolithographic feature size F with which the integrated circuitry is fabricated, or may be less than F. For example, existing or yet-to-be developed pitch multiplication techniques may be used in fabrication of some or all of the features.

Regardless, FIGS. 7 and 8 show an example embodiment wherein individual trenches 25 overlie two active areas 14 and the dielectric material space received there-between. Further, trenches 25 overlie two different conductive contacts 20 to the respective underlying active areas. The widths of active areas 14 and the space there-between may or may not be fabricated at the minimum feature size, and may or may not be equal. Regardless, other embodiment trenches 25 may be used. Embodiments of the invention are believed to have greatest applicability where individual conductive lines being fabricated have minimum widths of 20 nanometers and below. Further and regardless, trenches 25 might be modified after their initial fabrication, for example by etch of and/or deposition over their respective sidewalls.

Figure 9:
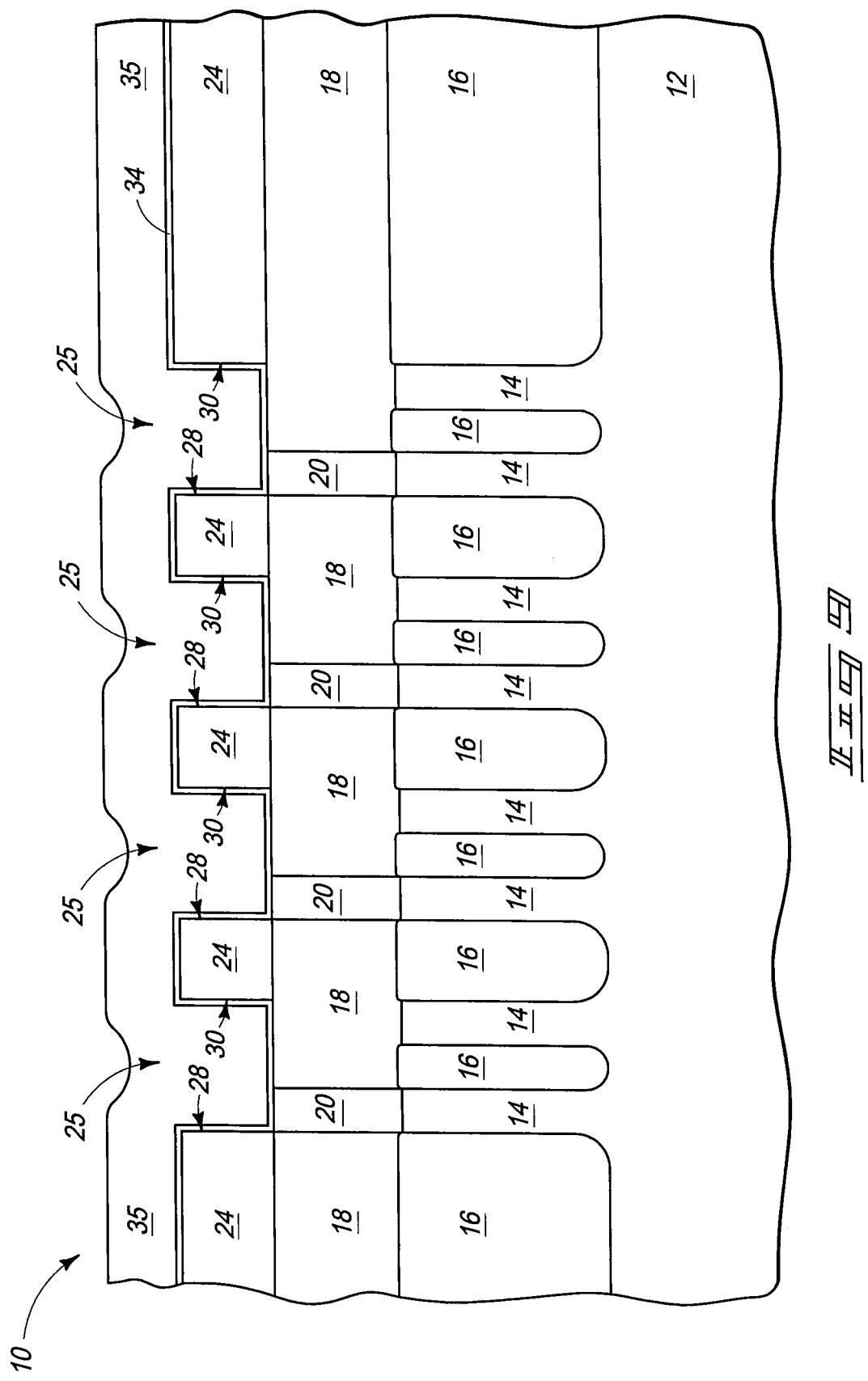
FIG. 9 is a view of the FIG. 8 substrate at a processing step subsequent to that shown by FIGS. 7 and 8.

Referring to FIG. 9, conductive material has been deposited to within the trenches to span between the respective first and second sidewalls. Such conductive material may be homogenous or non-homogenous, and may comprise different composition layers. In FIG. 9, the conductive material comprises a conductive liner 34 comprising a first composition and a conductive fill material 35 comprising a second composition which is received over conductive liner 34. Each material 34 and 35 may be homogenous or non-homogenous, and may comprise different composition layers. In one embodiment, some attributes of the stated first and second compositions are different relative to one another physically and/or chemically. An example first composition is one or both of titanium and titanium nitride which may facilitate adhesion of the conductive lines being formed to underlying insulative material 18 where such comprises silicon dioxide. Regardless, example fill materials 35 include aluminum, ruthenium, palladium, tungsten, copper, titanium and metal silicides.

Figure 10:
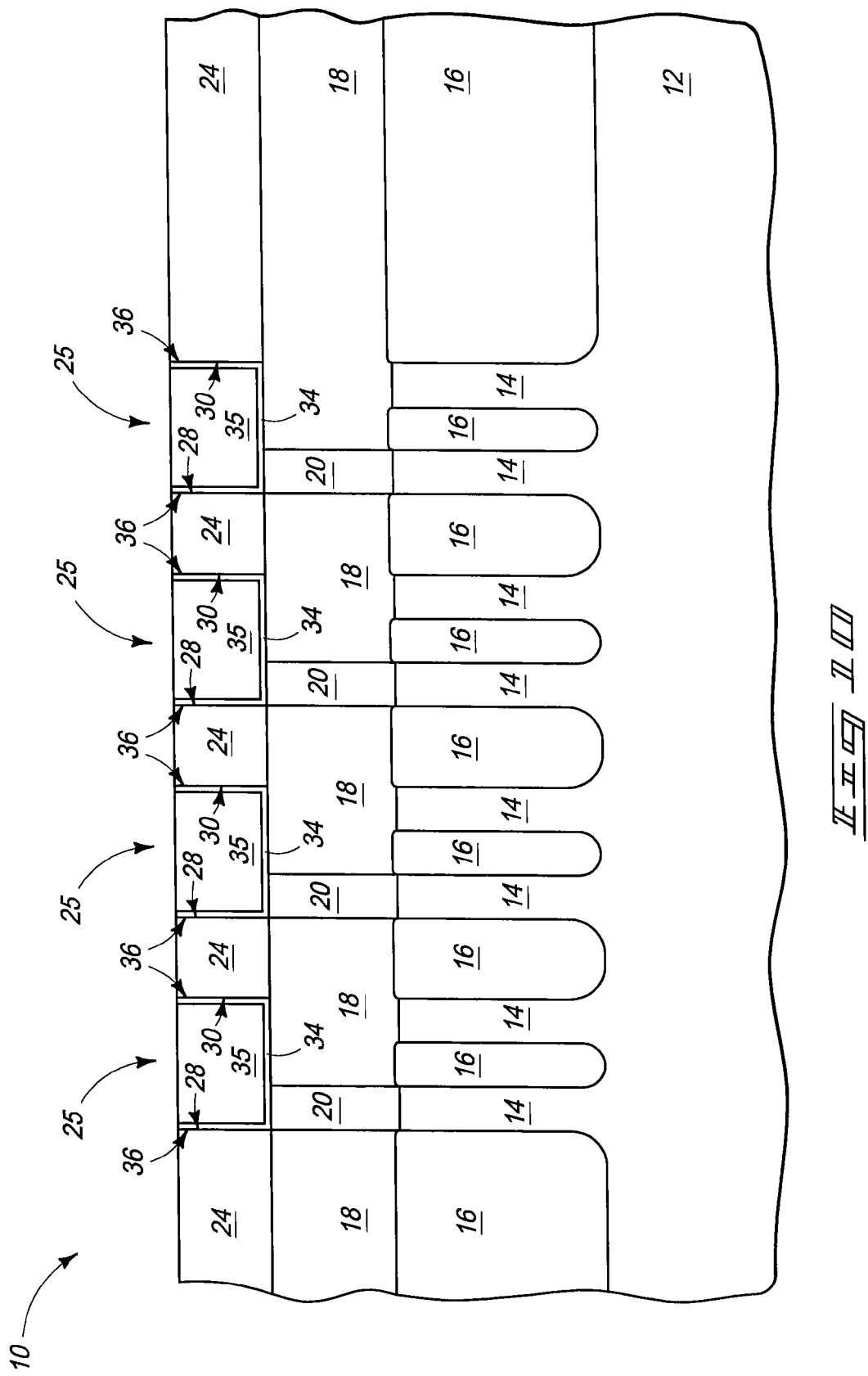
FIG. 10 is a view of the FIG. 9 substrate at a processing step subsequent to that shown by FIG. 9.

FIG. 9 shows conductive material 34/35 having been deposited to overfill trenches 25. Alternate techniques may of course be used, for example a selective deposition within trenches 25 using electrochemical or other existing or yet-to-be developed processing which may or may not fully fill or over fill trenches 25. Regardless, FIG. 10 shows removal of conductive material 34/35 back at least to damascene material 24. Multiple conductive lines will be fabricated from conductive material 34/35 within each trench, with the discussion proceeding with respect to fabrication of a pair of conductive lines within each trench 25. In one embodiment, conductive material 34/35 comprises a first sidewall 36 of each of a pair of conductive lines being formed with respect to each trench 25.

Herein lies one possible advantage of certain embodiments of the invention which may be achieved in overcoming some of the issues indentified in the Background section with respect to existing prior art challenges. Specifically, in existing damascene processing, as individual minimum conductive line width has reached 20 nanometers and below, it is difficult to completely fill such narrow width damascene trenches completely with conductive material. Where multiple 20 nanometer or sub-20 nanometer lines are formed relative to a damascene trench in accordance with the continuing discussion, complete spanning of the conductive material between trench sidewalls which are more than 20 nanometers apart may more readily occur regardless of deposition method of the conductive material.

Figure 11:
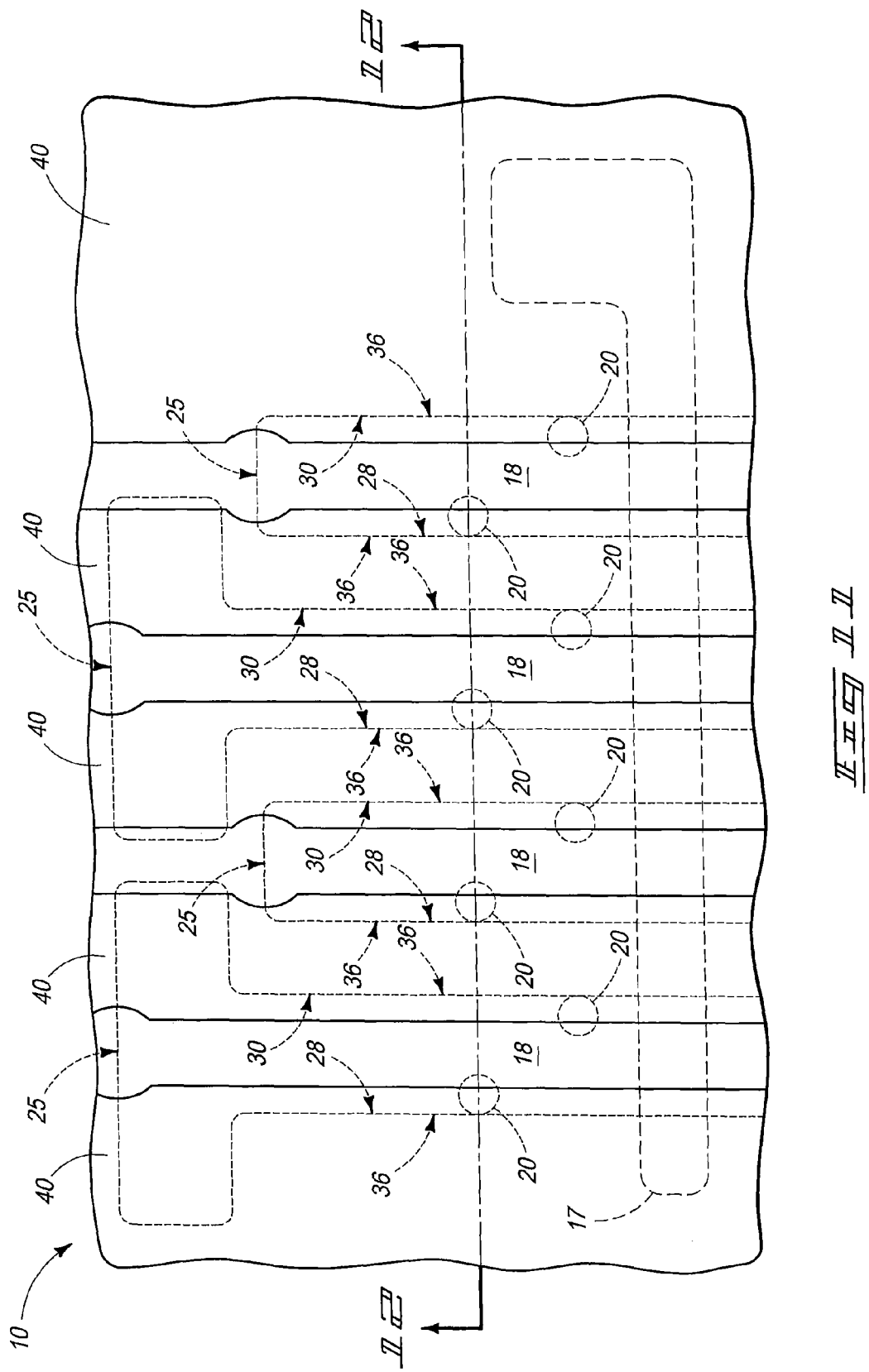
FIG. 11 is a top plan view of the FIG. 7 substrate at a processing step subsequent to that shown by FIG. 10.
Figure 12:
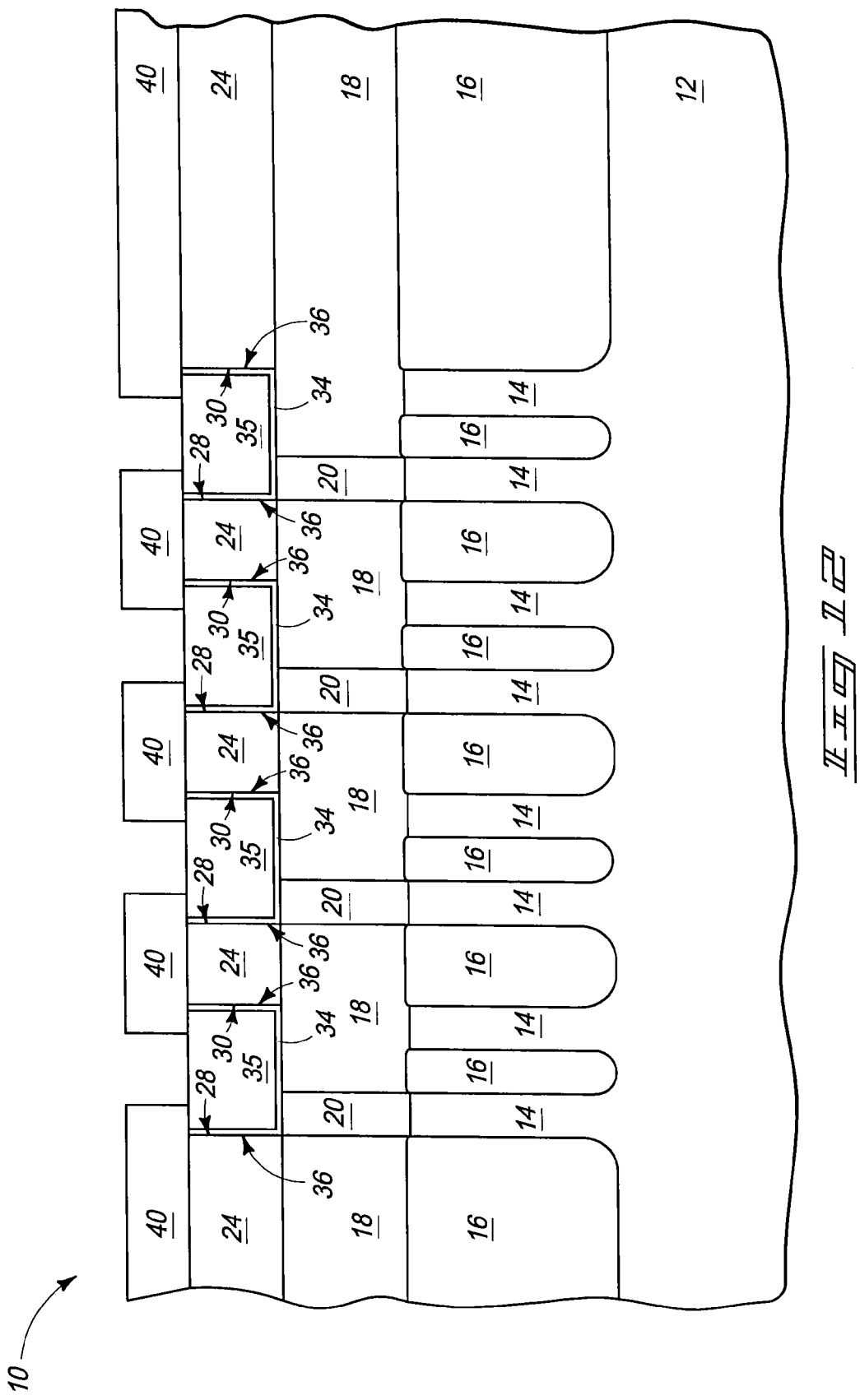
FIG. 12 is a cross section taken through line 12-12 in FIG. 11.

Referring to FIGS. 11 and 12, masking material 40 has been deposited and patterned relative to underlying substrate material. Where lithography is used, such may or may not be patterned to be at, above, or below minimum lithographic feature size with which the integrated circuitry is fabricated. Examples for material 40 include photoresist (including multi-layer resist with or without hard masking material), amorphous carbon, and transparent carbon.

Figure 13:
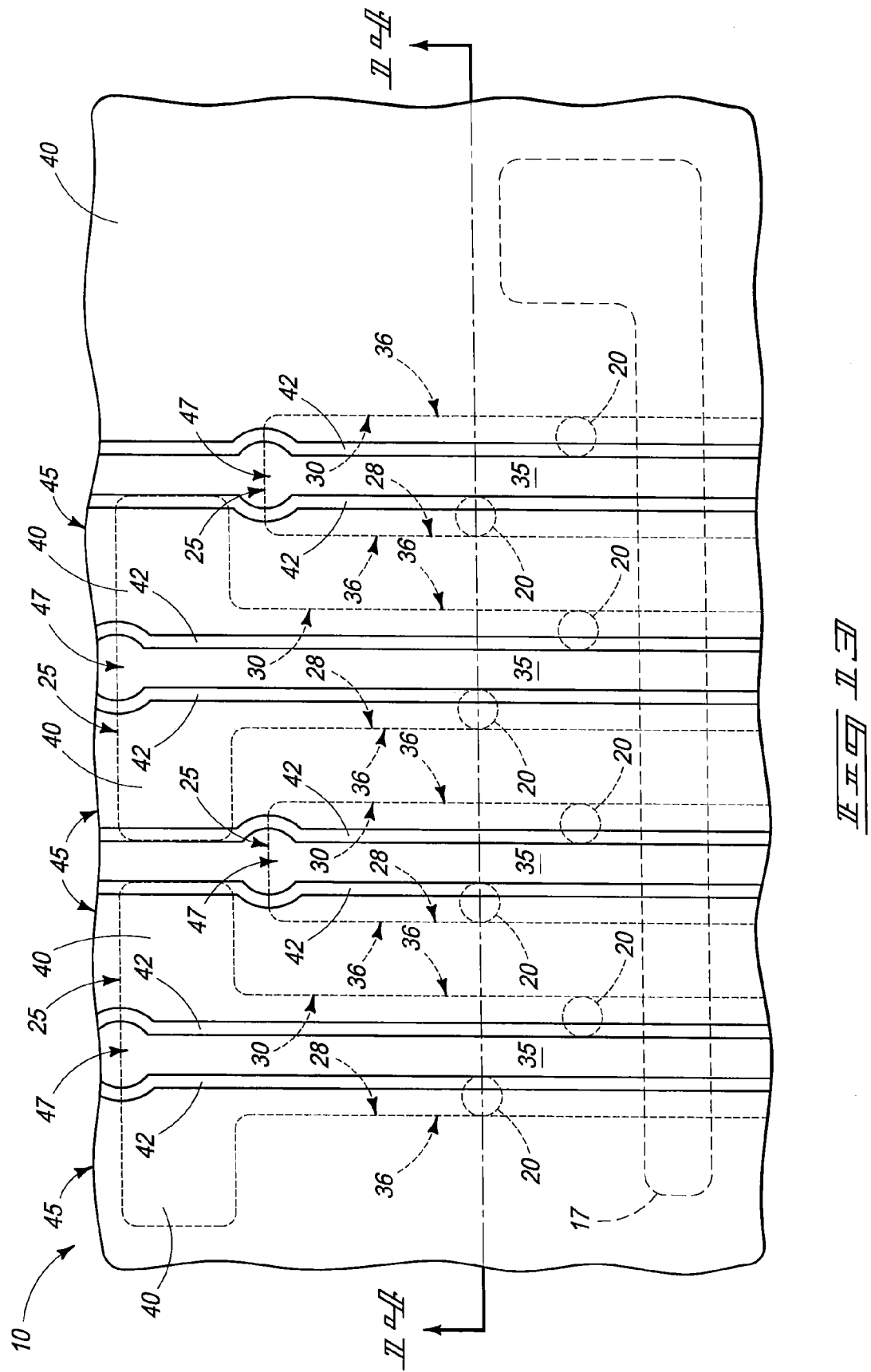
FIG. 13 is a top plan view of the FIG. 11 substrate at a processing step subsequent to that shown by FIGS. 11 and 12.
Figure 14:
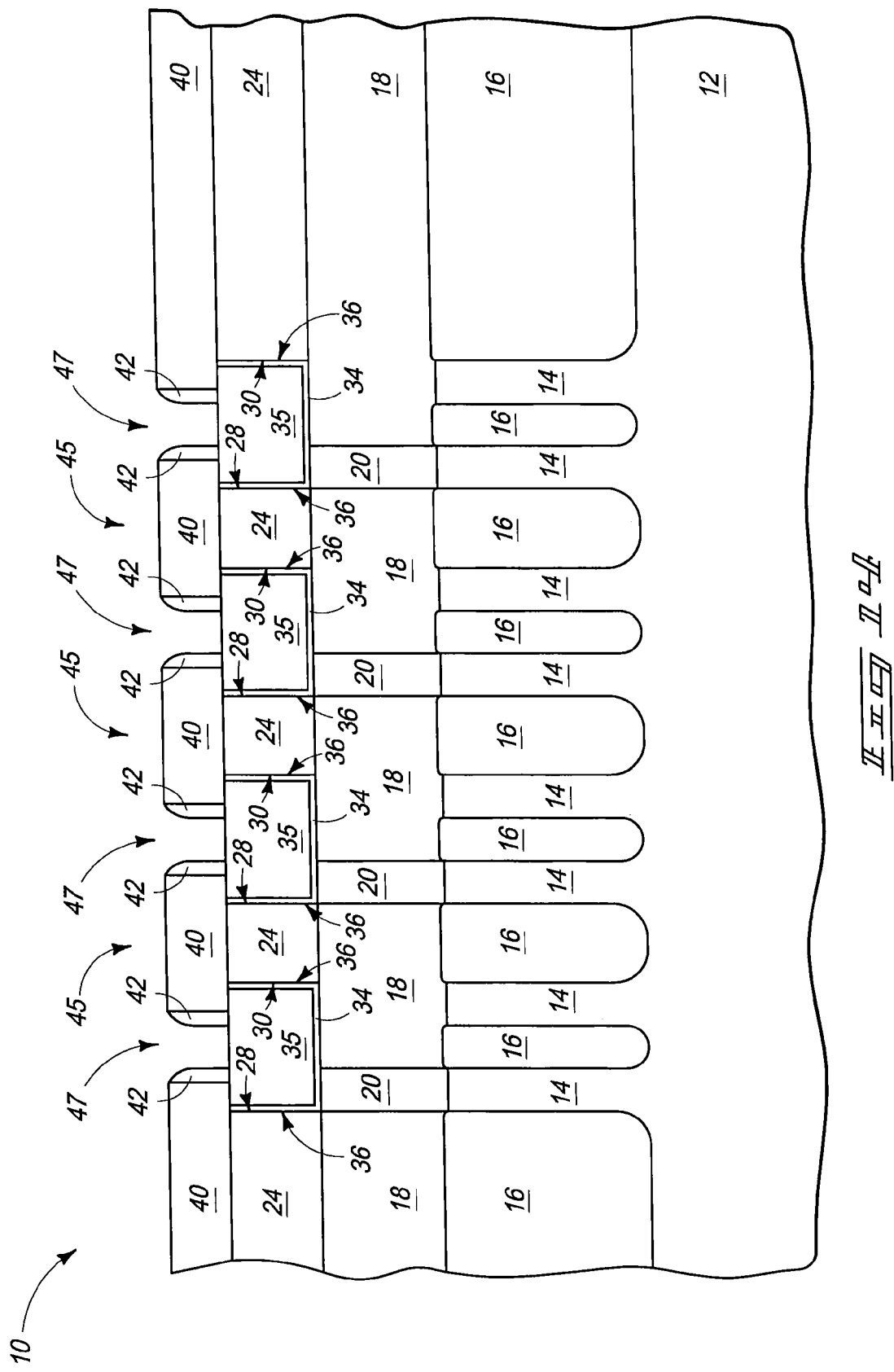
FIG. 14 is a cross section taken through line 14-14 in FIG. 13.

Referring to FIGS. 13 and 14, spacers 42 have been formed on lateral sidewalls of masking material 40. Such may be formed, for example by deposition of a material over masking material 40 to a thickness of a desired maximum width of spacers 42 followed by anisotropic etching of such material. Alternately, spacers 42 may be grown largely selectively relative to sidewalls of masking material 40. For example where masking material 40 comprises transparent carbon, example plasma deposition chemistries for growing spacers 42 are fluorocarbons, hydrofluorocarbons, chlorofluorocarbons, halocarbons or hydrohalocarbons. Specific examples include $CHF_3$, $CH_2F_2$, $C_2F_6$, $C_2HF_5$, and $C_3F_8$. The flow rate may depend on which feed gas is used, and can be determined by one of skill in the art. Generally, flow rates would be in the range of 25-200 sccm, although flow rates outside this range may also be used. As a specific example in a plasma deposition tool, source (top) power may be from 1000 to 3500 Watts, bias (bottom) power at from 0 to 400 Watts, chamber pressure from 2 to 5 mTorr, and gas flow rate from 10 sccm to 50 sccm. Such will tend to deposit greater thickness of material 42 over sidewalls as opposed to over top surfaces.

Regardless, FIGS. 13 and 14 show an example embodiment wherein masking blocks 45 have been formed, and which comprise material 40 and spacer material 42. Openings 47 are received between masking blocks 45. Individual of masking blocks 45 span between and partially mask respective immediately adjacent of two trenches 25. Masking blocks 45 may be fabricated in other manners and be of other shape(s).

Figure 15:
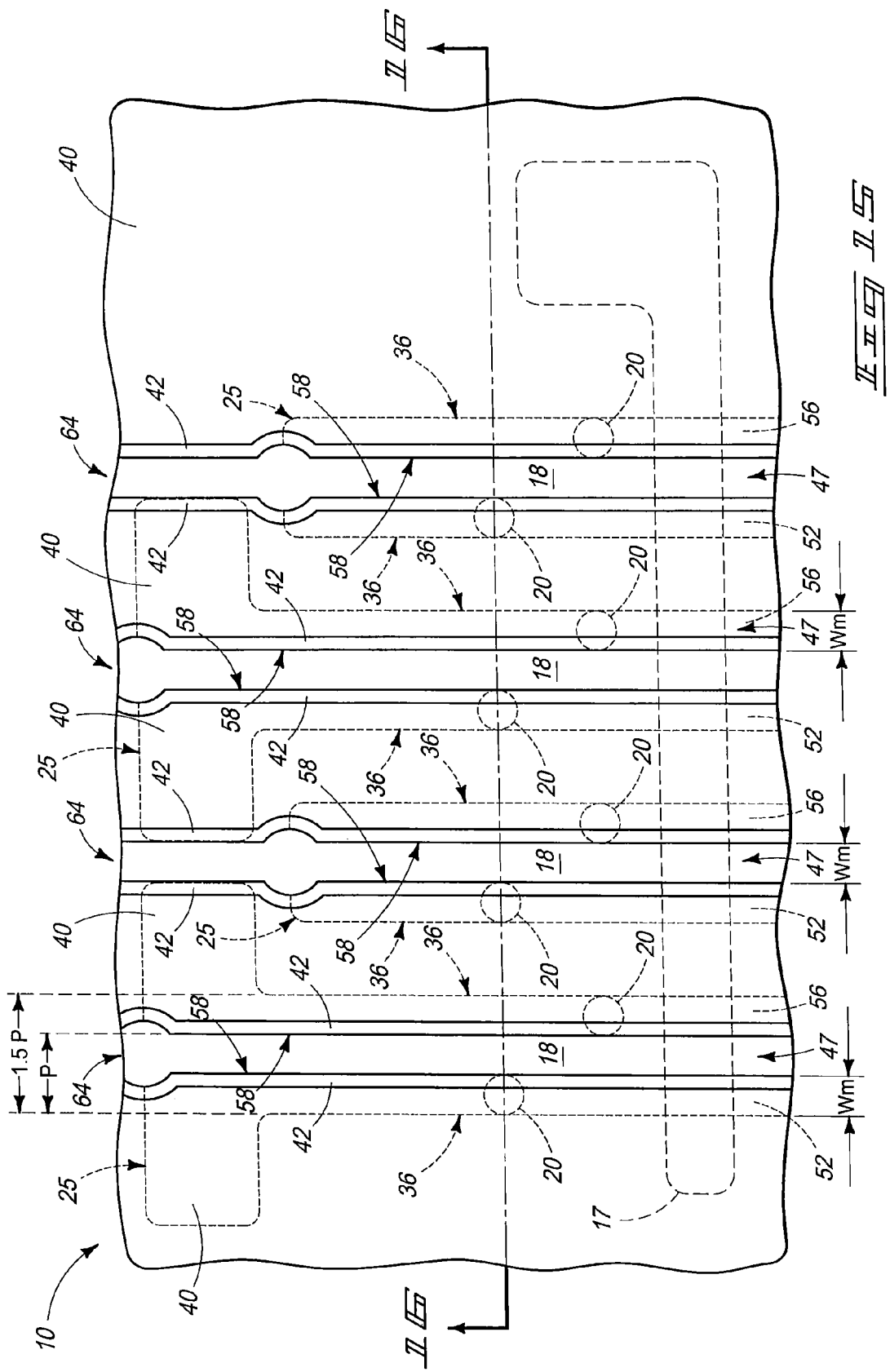
FIG. 15 is a view of the FIG. 14 substrate at a processing step subsequent to that shown by FIGS. 13 and 14.
Figure 16:
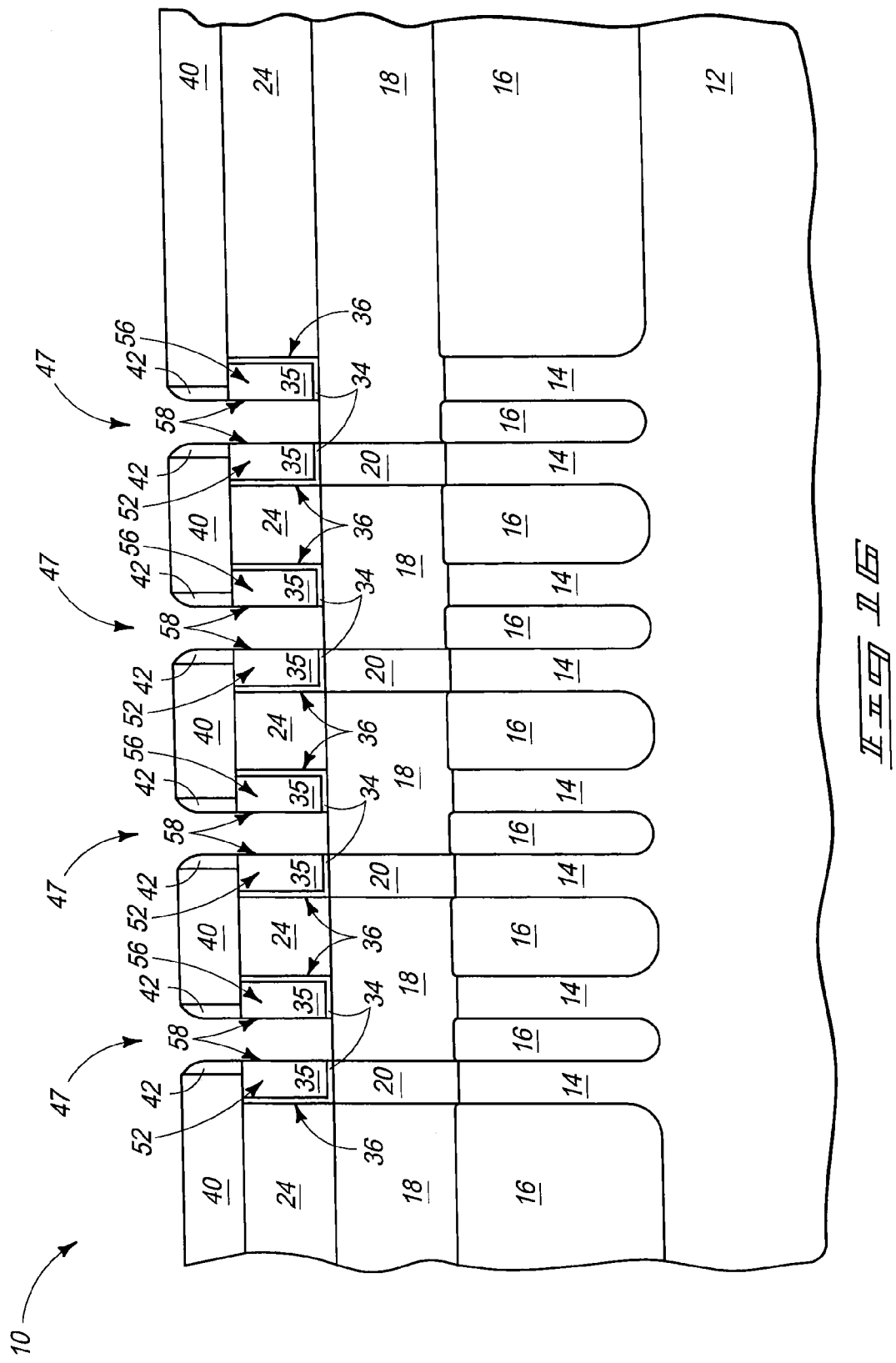
FIG. 16 is a top plan view of the FIG. 13 substrate at a processing step subsequent to that shown by FIG. 15.

Referring to FIGS. 15 and 16, conductive material 34/35 has been etched through longitudinally between first trench sidewall 28 and second trench sidewall 30 (FIG. 16.). In one embodiment and as shown, such has been conducted through openings 47 between masking blocks 45. FIGS. 15 and 16 show such etching as forming a first conductive line 52 and a second conductive line 56 with respect to each trench 25. Such also forms a longitudinal contour of a second sidewall 58 of each of first and second conductive lines 52 and 56 within each trench 25. In one embodiment, the longitudinal etching has formed conductive lines 52 and 56 to be mirror images of one another, for example as shown in FIG. 16.

FIGS. 15 and 16 show one embodiment wherein the etching of the conductive material was centered between the sidewalls of trench 25. Such also show first conductive lines 52 and second conductive lines 56 within a respective trench 25 as being of the same shape in lateral cross section along at least a majority of length of conductive lines 52 and 56. Further, FIGS. 15 and 16 show an example embodiment wherein the etching of conductive material 34/35 forms first and second conductive lines 52, 56 to be mirror images of one another in lateral cross section along at least a majority of length of the first and second conductive lines. In one embodiment and as shown, the etching of conductive material 34/35 forms each of the first and second conductive lines to have first sidewall 36 to be of the first composition of layer 34 and also to comprise a base layer of each line 52, 56 of the first composition of layer 34. Further, the etching of the conductive material has formed that portion of second sidewall 58 which is received above base layer 34 of each of the first and second conductive lines to be of the second composition of material 35.

FIGS. 15 and 16 show an example embodiment wherein conductive lines 52 and 56 have a minimum width $W_m$ (FIG. 15). In one embodiment, $W_m$ is no greater than 20 nanometers, for example wherein the minimum space between the longitudinal contours within each of the conductive lines defined by sidewalls 36 and 58 is no greater than 20 nanometers. Regardless, in some embodiments, minimum lateral width of first and second conductive lines 52, 56 may be further reduced or increased by etching or conductive material addition, respectively. FIGS. 15 and 16 also show an embodiment wherein the etching of the conductive material forms a space 64 within trenches 25 between the respective first and second conductive lines 52, 56. In one embodiment, minimum width of space 64 may be equal to about $W_m$ in lateral cross section. Alternately, the minimum width of space 64 may be less than or greater than $W_m$.

In one embodiment, first and second conductive lines 52, 56 may be considered as comprising a pitch P (FIG. 15), and wherein the minimum width 32 (FIGS. 7 and 8) of trenches 25 is equal to about 1.5 P as shown, and in one embodiment regardless of whether trench minimum width 32 is about 3 $W_m$.

Example first and second conductive lines 52, 56 may be fabricated to comprise bit lines in DRAM and/or flash memory circuitry. Lines 52, 56 may additionally or alternately be used in other circuitry, such as logic circuitry.

Figure 17:
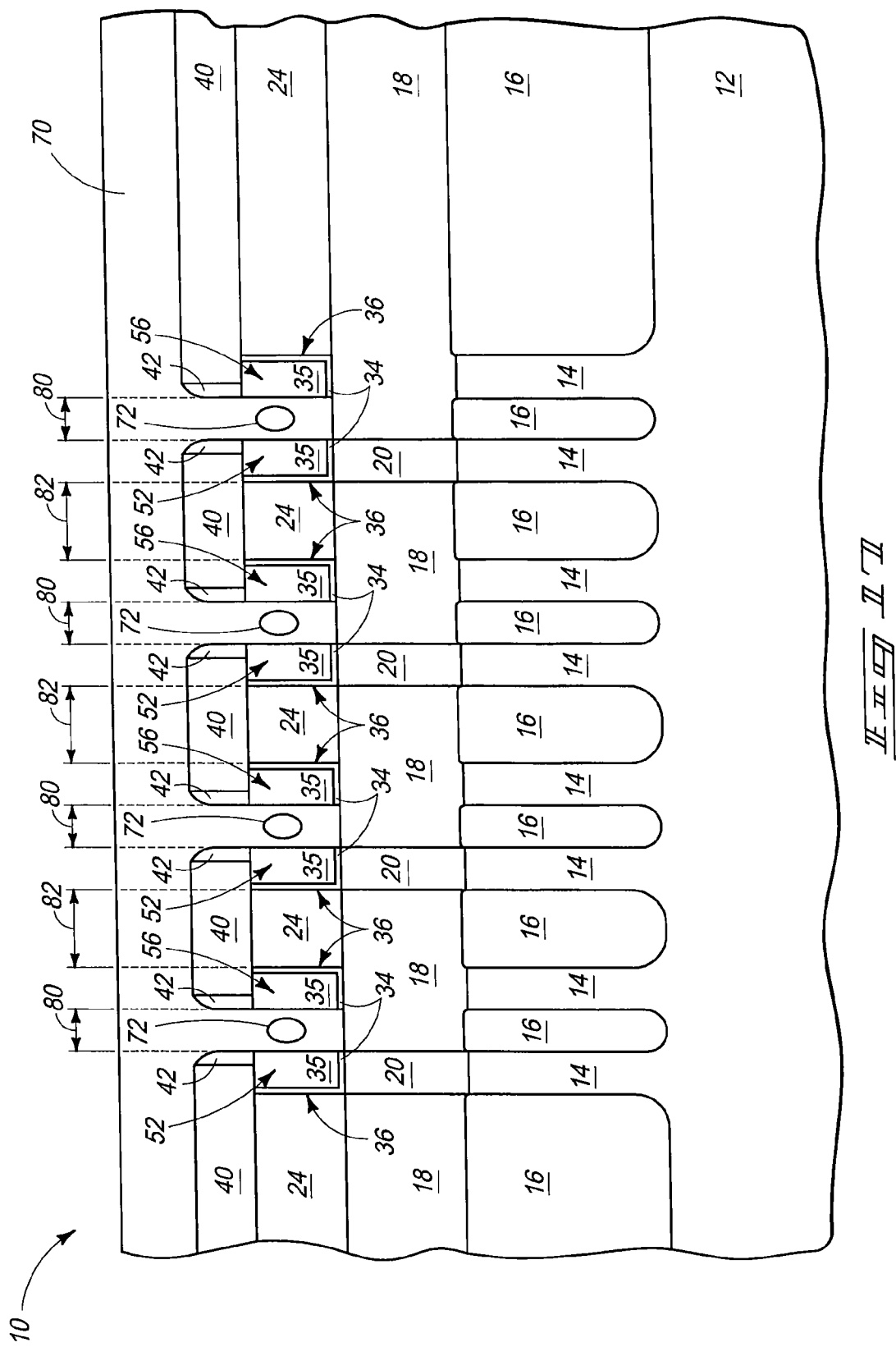
FIG. 17 is a view of the FIG. 16 substrate at a processing step subsequent to that shown by FIG. 16.

Referring to FIG. 17, dielectric material 70 has been deposited over underlying substrate and to fill spaces 64 (FIG. 15) with a dielectric material. Dielectric material 70 may be homogenous or non-homogenous, and may comprise different composition layers. FIG. 17 shows one ideal embodiment wherein material 70 has been deposited to comprise a singular void 72 received between example mirror image pairs of conductive lines 52/56. Provision of voids 72 as shown may provide effective decreased dielectric constant k, and thereby reduced parasitic capacitance between adjacent conductive lines 52 and 56. In some embodiments, a singular void 72 may be formed, and in other embodiments multiple voids may be formed. Regardless, voids 72 may be formed during the act of depositing dielectric material 70, although such may be formed thereafter.

For example, void formation may result in a plasma enhanced chemical deposition process of a silicon dioxide material using tetraethylorthosilicate (TEOS), and $O_2$ as deposition precursors. Void formation can be promoted in such a deposition by maximizing deposition rate, maximizing precursor flow rates, using single frequency processors, maximizing temperature, and reducing pressure. Voids can be promoted by intentionally degrading the step coverage of the deposition process. Typically, this can be done by running the process in mass transfer controlled regime in which reactant flux reaching the surface of the structure controls deposition rate. By creating a flux gradient from top to bottom, faster growth on top of an opening will be achieved and effectively forms a singular void when pinched off. Voids 72 may or may not be equally spaced laterally between the immediately adjacent conductive lines 52 and 56. Regardless, FIG. 17 shows ideal planarization of dielectric material 70.

Damascene material 24 may be removed in whole or in part after formation of lines 52 and 56, and before depositing material 70. Alternately, none of damascene material may be removed after formation of lines 52 and 56.

Figure 18:
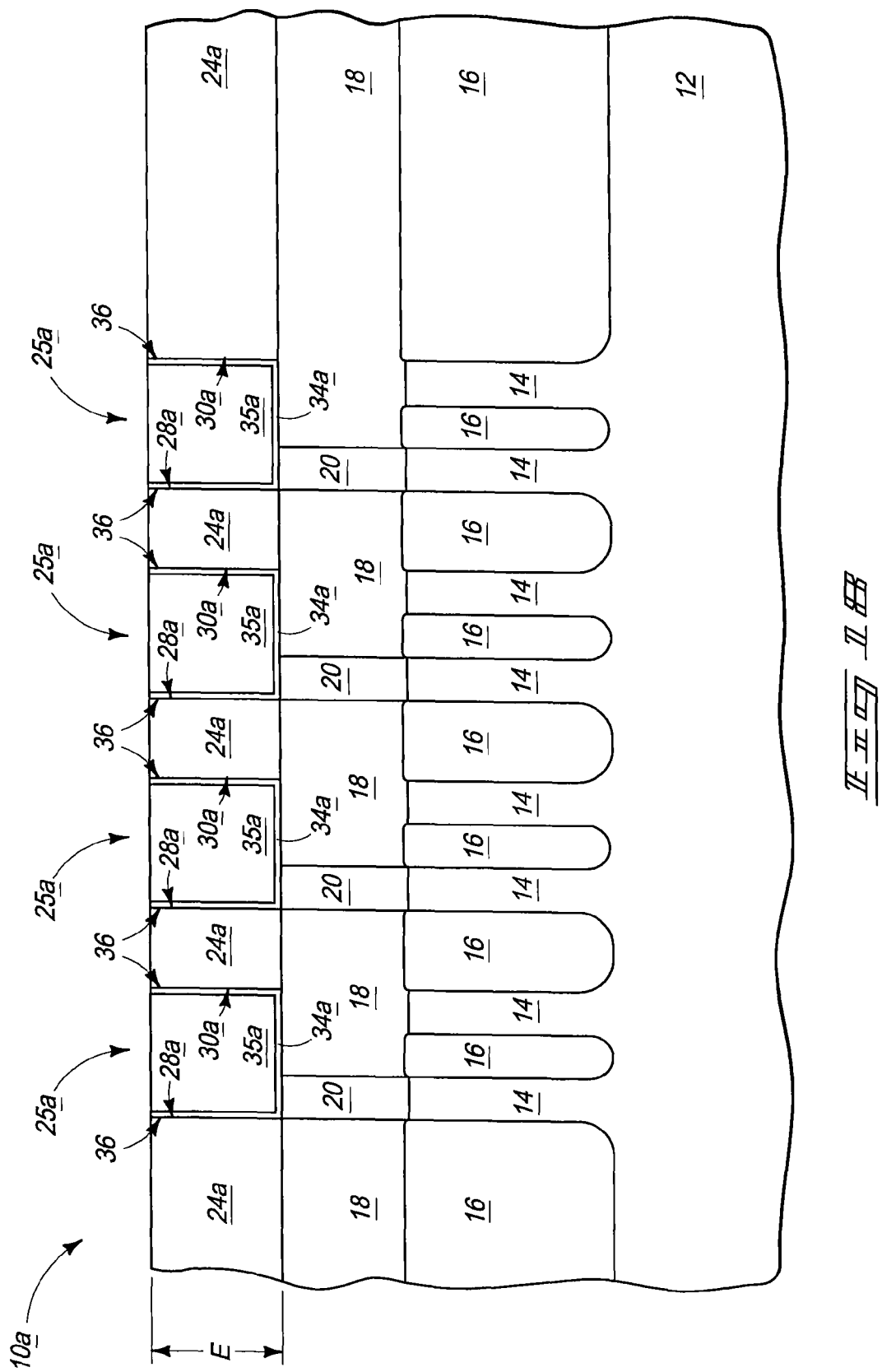
FIG. 18 is a diagrammatic sectional view of a substrate in process in accordance with an embodiment of the invention.

Another embodiment is described with reference to FIGS. 18-26 with respect to a substrate fragment 10a. Like numerals from the first-described embodiment have been utilized where appropriate, with some construction differences being indicated with the suffix "a" or with different numerals. In FIG. 18, damascene material 24a is shown to be slightly thicker than that of the first-described embodiment wherein, for example, first and second conductive lines will be formed with respect to each trench 25a which are about of the same thickness as that in the first-described embodiment. Trenches 25a accordingly are shown to include greater volume of material 34a and 35a than in the first-described embodiment. For purposes of the continuing discussion with respect to this embodiment, trenches 25a have first and second opposing trench sidewalls 28a and 30a which span an elevation E of damascene material 24a.

Figure 19:
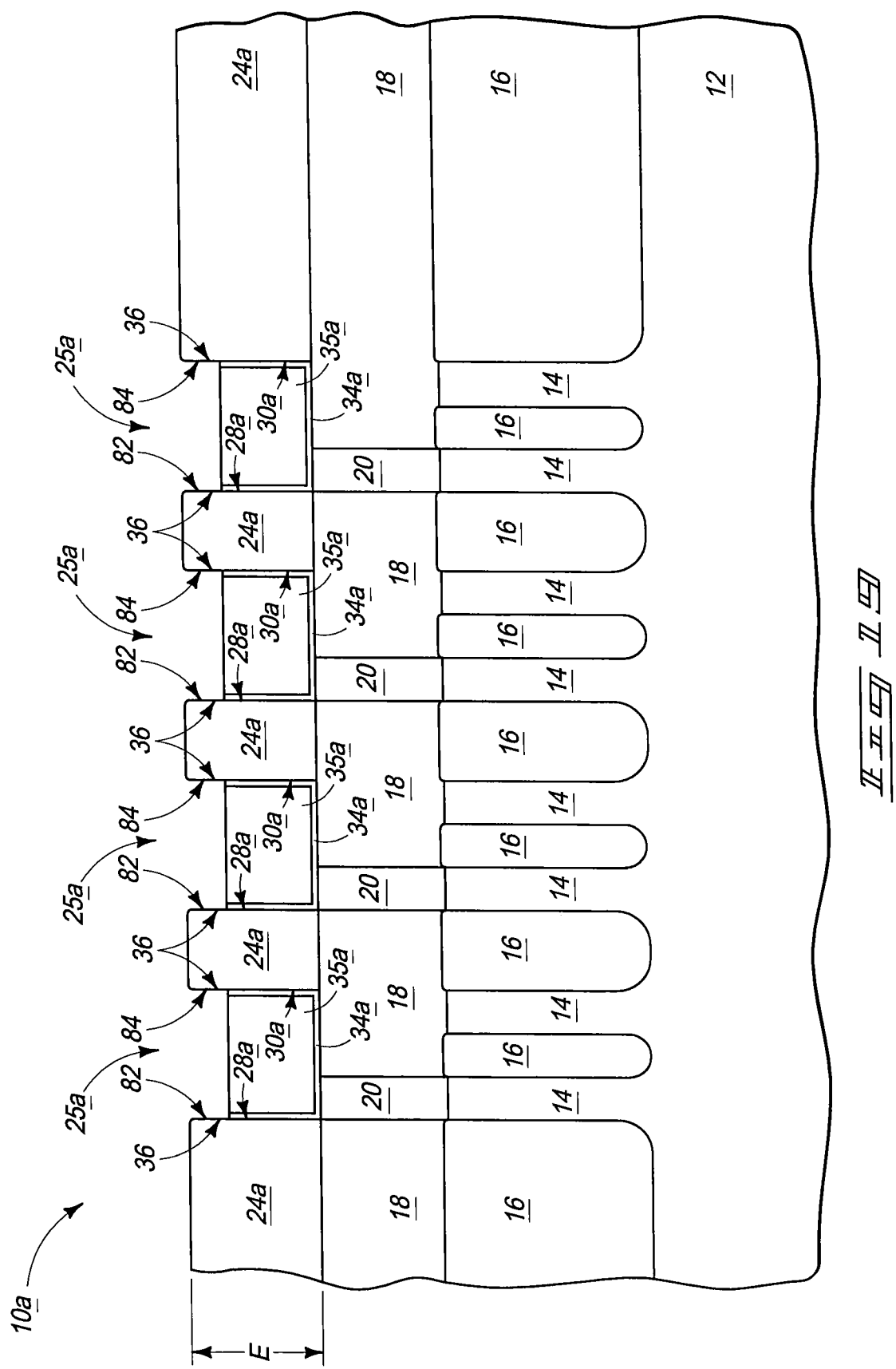
FIG. 19 is a view of the FIG. 18 substrate at a processing step subsequent to that shown by FIG. 18.

Referring to FIG. 19, conductive material 34a/35a has been recessed within trenches 25a. A first trench-wall 82 and a second trench-wall 84 are formed over recessed conductive material 34a/35a, and wherein first trench-wall 82 and second trench-wall 84 are received within elevation E of damascene material 24a. In one embodiment and as shown, first trench-wall 82 is formed to comprise an upper portion of first trench sidewall 28a and second trench-wall 84 is formed to comprise an upper portion of second trench sidewall 30a. Such may occur where conductive material 34a/35a is etched selectively relative to damascene material 24a such that negligible etching of sidewalls 28a and 30a occurs above conductive material 34a/35a. Alternately if damascene material 24a is etched laterally during or after etch of conductive material 34a/35a, the first trench-wall and the second trench-wall may be laterally cut-back (not shown) such that the trenches widen above conductive material 34a/35a.

Figure 20:
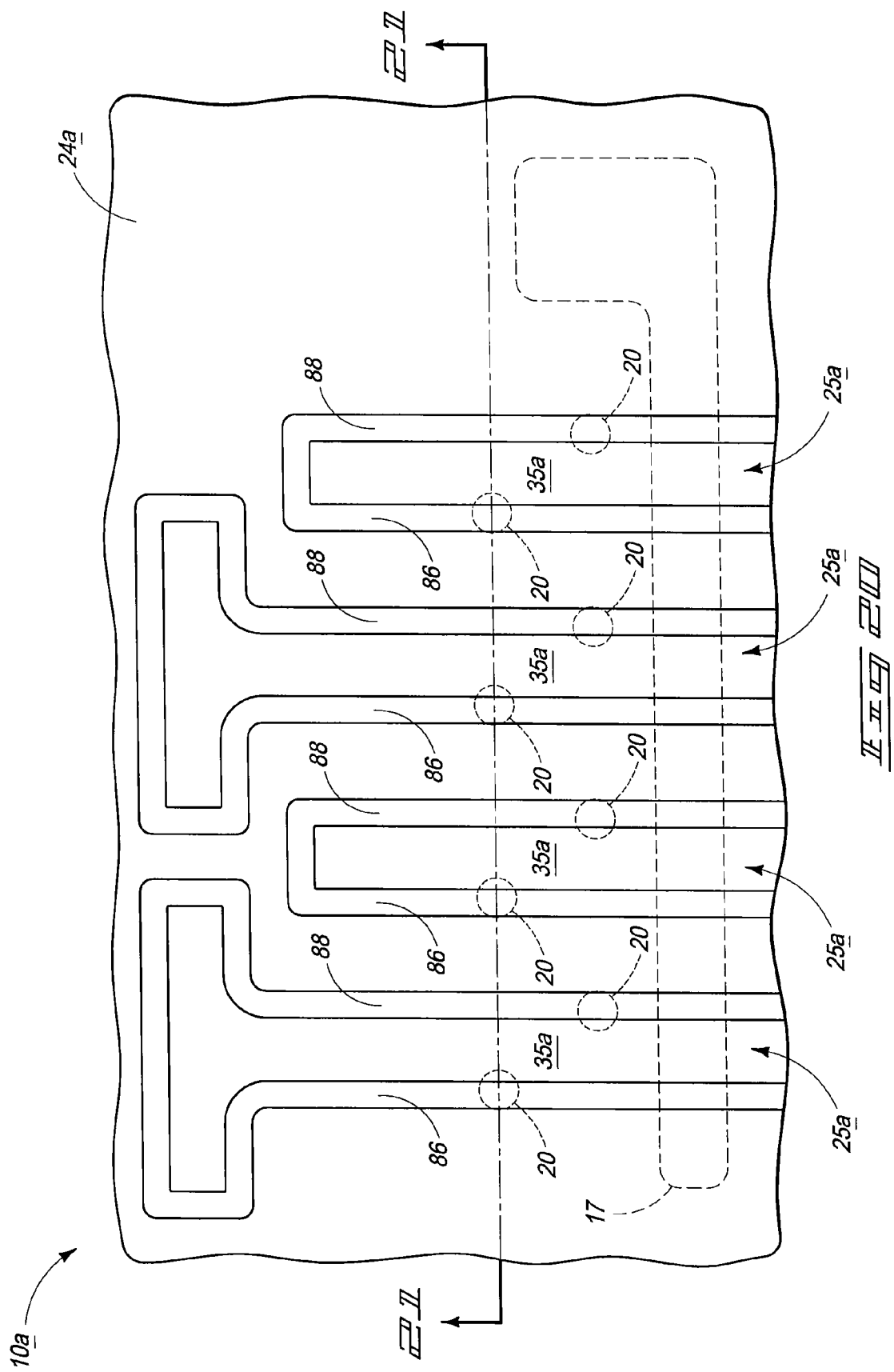
FIG. 20 is a top plan view of the FIG. 19 substrate at a processing step subsequent to that shown by FIG. 19.
Figure 21:
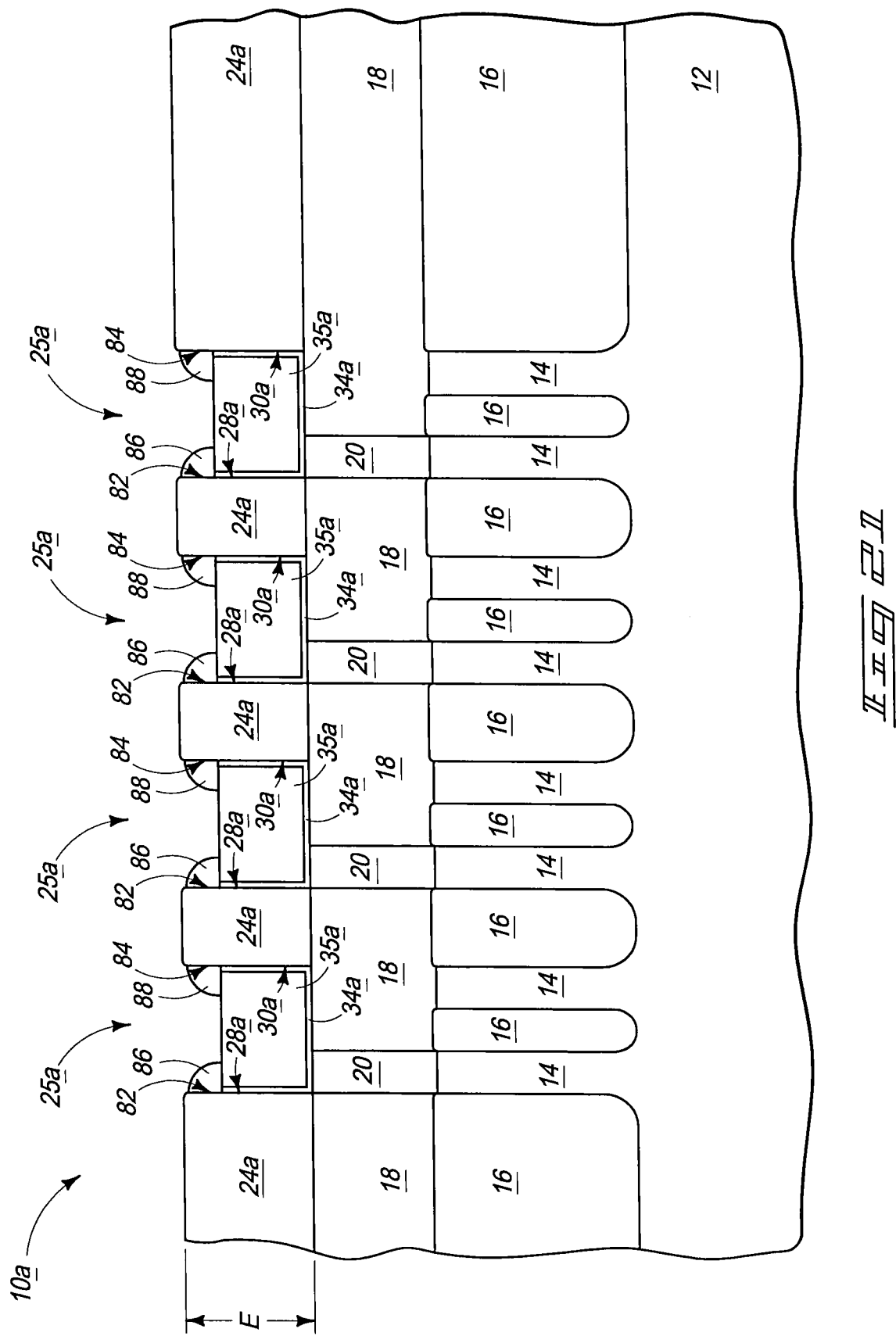
FIG. 21 is a cross section taken through line 21-21 in FIG. 20.

Referring to FIGS. 20 and 21, a first etch mask 86 has been formed against first trench-wall 82 and a second etch mask 88 has been formed against second trench-wall 84. In one embodiment, such may be formed by depositing a spacer-forming layer to less than fill remaining volume of trenches 25a after the act of recessing depicted by FIG. 19. Thereafter, the spacer-forming layer may be anisotropically etched to form the depicted first and second etch masks to respectively comprise a sidewall spacer received against the first and second trench-walls, respectively. Accordingly, deposited thickness of the spacer-forming layer may be used to largely determine the lateral dimensions of the first and second etch masks. In one embodiment, such anisotropic etching may be conducted without any mask being received over the spacer-forming layer, for example to avoid adding a mask step as was depicted by way of example in FIGS. 11 and 12 of the first-described embodiment. Alternately, a lithographic masking step may be conducted to form the first and second etch masks. Regardless, first and second etch masks 86, 88 may alternately be formed, by way of example, by thermal growth laterally inward from first trench-wall 82 and from second trench-wall 84.

First and second etch masks 86, 88 may be formed of insulative, conductive, and/or semiconductive material, for example depending upon whether some or all of the material from which the first and second etch masks are formed is to remain as part of the finished integrated circuitry construction. One example comprises an oxide, such as silicon dioxide, deposited by atomic layer deposition. In one embodiment, the etch rate of the material of the first and second etch masks in a given chemistry is higher than the etch rate of damascene material 24a.

FIG. 20 depicts one embodiment wherein the first and second etch masks are formed to comprise an interconnected ring within each trench 25a. The lower terminuses of trenches 25a will, for example, comprise mirror images of that depicted in FIG. 20 whereby the material from which first and second etch masks 86 and 88 are formed interconnects to form a ring within each trench 25a. Pinching-off (not shown) may occur of the material from which the first and second etch masks are formed at the widened ends of the depicted example trenches 25a.

Figure 22:
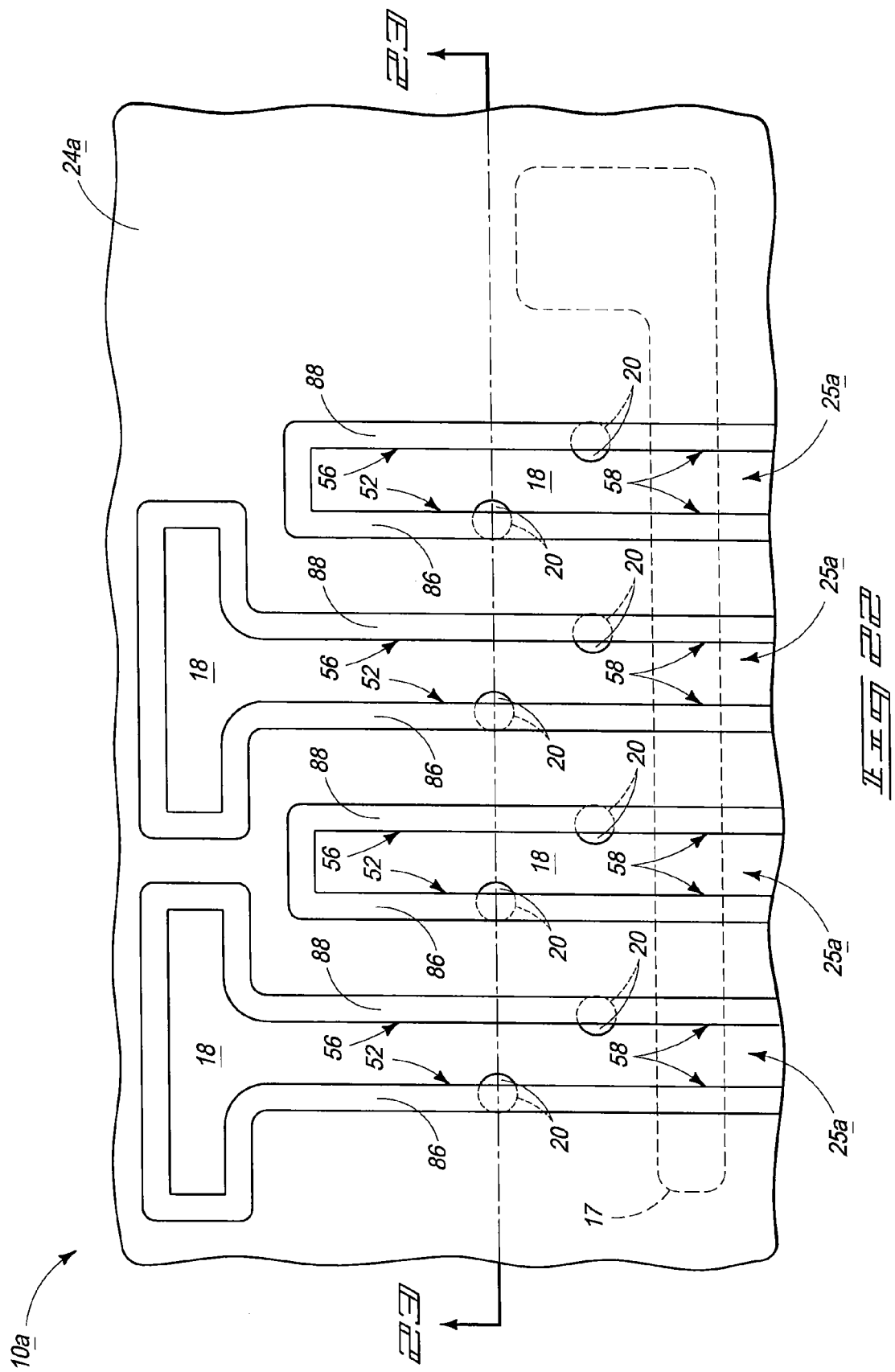
FIG. 22 is a top plan view of the FIG. 20 substrate at a processing step subsequent to that shown by FIGS. 20 and 21.
Figure 23:
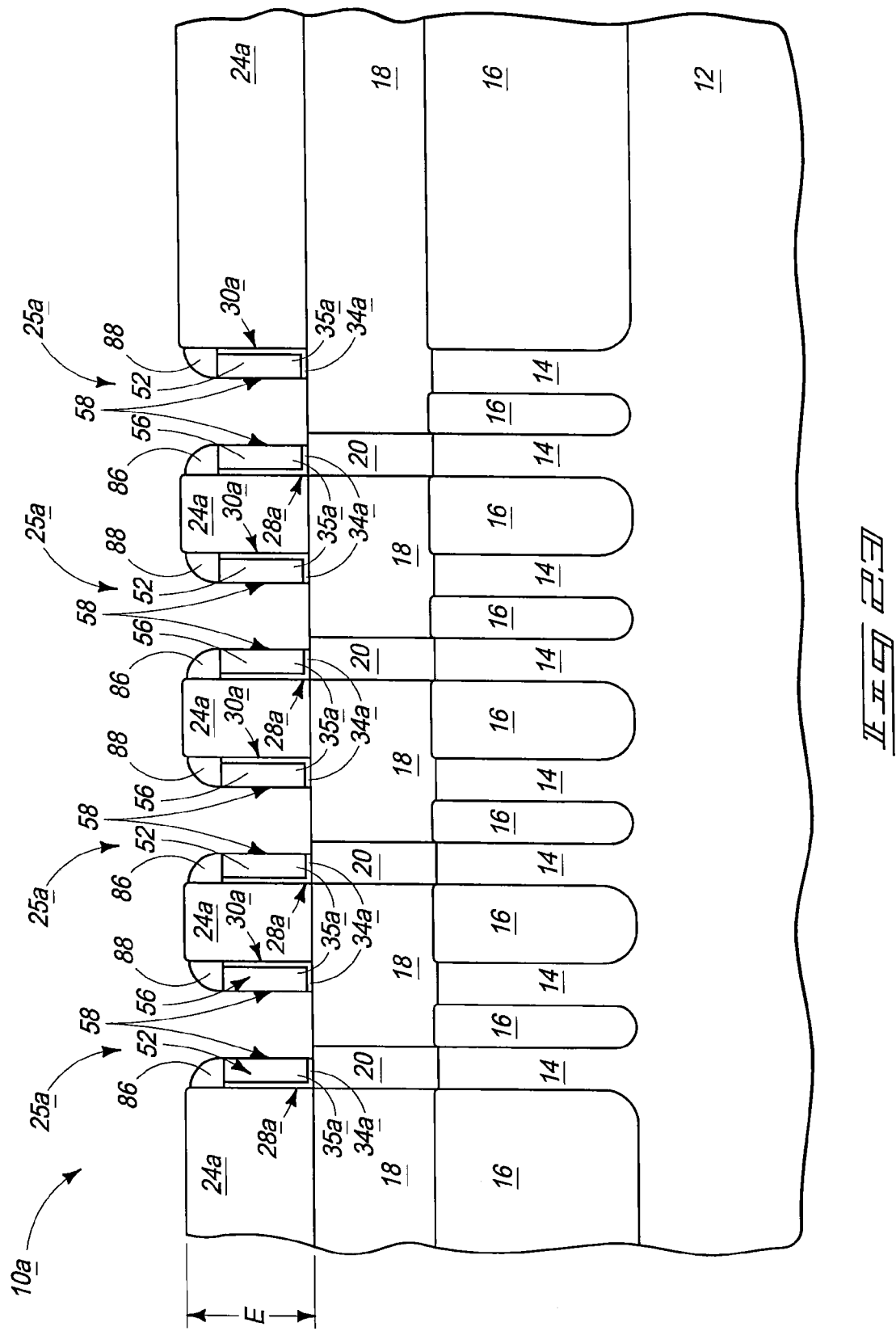
FIG. 23 is a cross section taken through line 23-23 in FIG. 22.

Referring to FIGS. 22 and 23, and using first etch mask 86 and second etch mask 88 as masking, etching has been conducted through conductive material 34a/35a longitudinally between the first and second trench sidewalls 28a and 30a, respectively. Such forms a longitudinal contour of second sidewall 58 of first conductive line 52 within each trench 25a and forms a longitudinal contour of second sidewall 58 of second conductive line 56 within each trench 25a.

FIGS. 22 and 23 show an embodiment wherein first conductive line 52 and second conductive line 56 as initially formed comprise an interconnected ring of conductive material, for example as being formed using an interconnected ring of the first and second etch masks 86 and 88 as an etching mask. Such ring of conductive material may be broken in at least two locations to separate first conductive line 52 from being electrically interconnected with second conductive line 56 within each trench. An example manner for doing so is described with reference to FIGS. 24 and 25.

Figure 24:
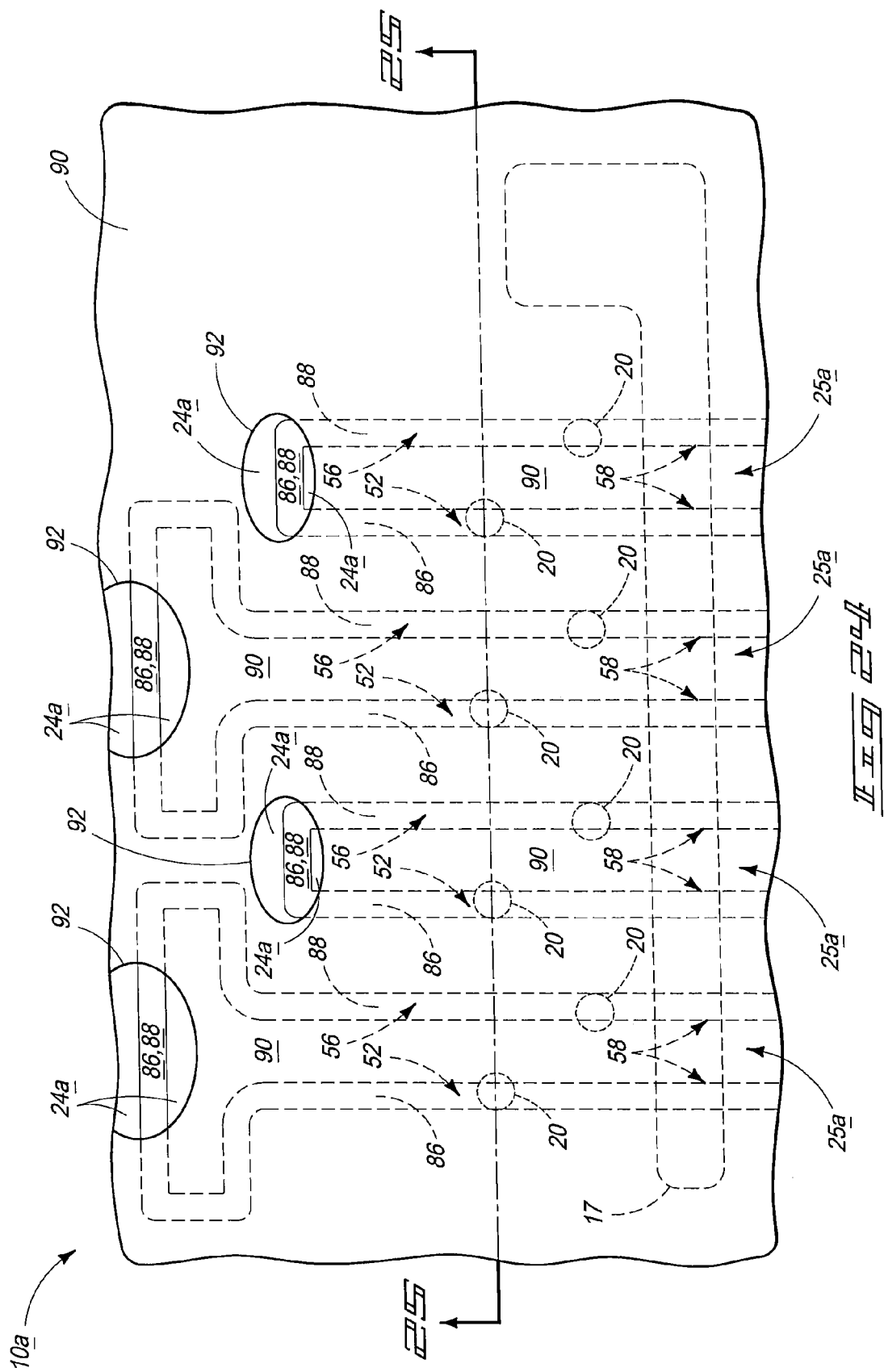
FIG. 24 is a top plan view of the FIG. 22 substrate at a processing step subsequent to that shown by FIGS. 22 and 23.
Figure 25:
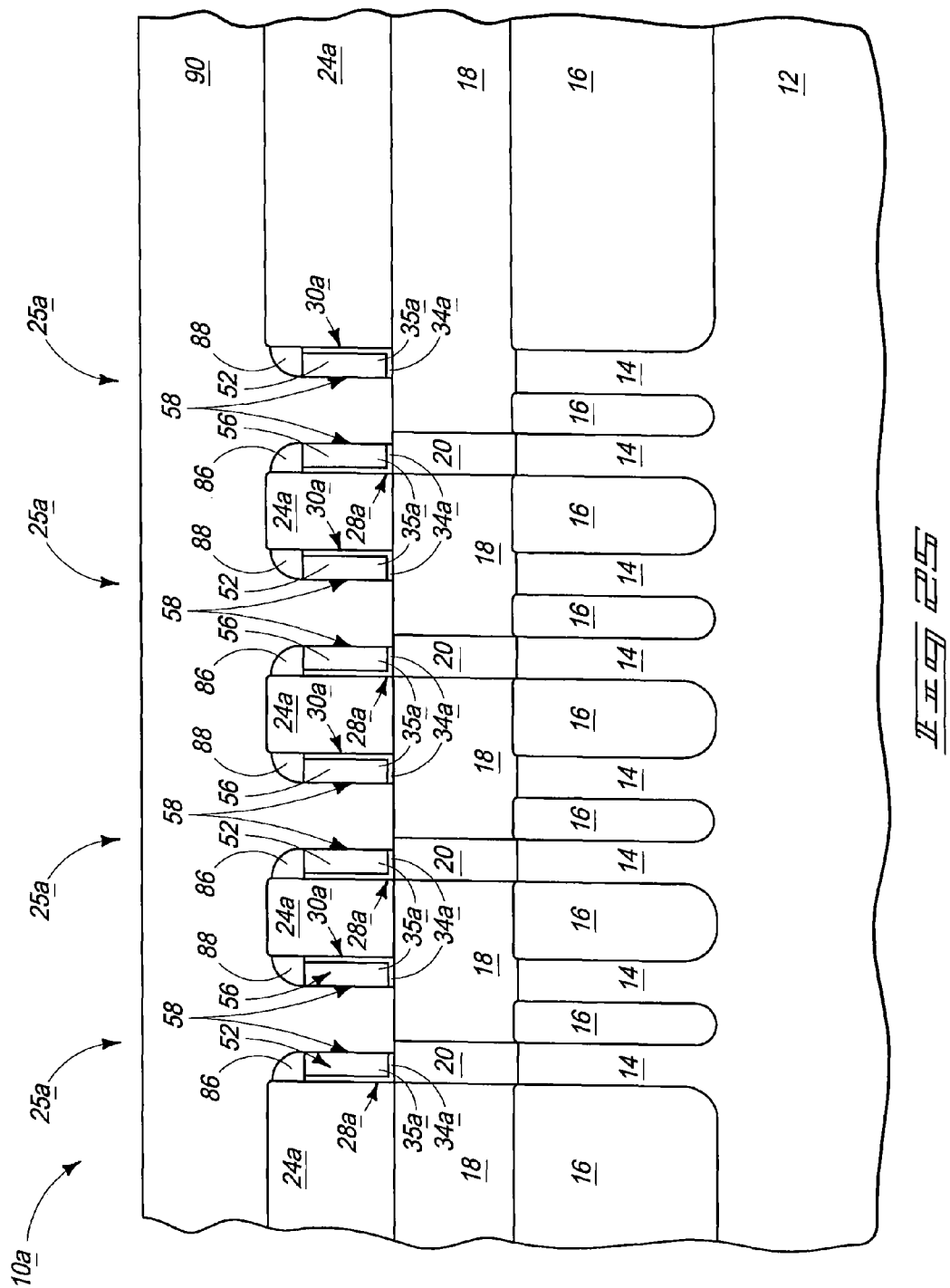
FIG. 25 is a cross section taken through line 25-25 in FIG. 24.

In FIGS. 24 and 25, masking material 90 has been deposited as part of substrate 10a, and mask openings 92 have been formed there-through at or near the ends of the respective trenches. Corresponding mask openings 92 (not shown) would be formed at the opposing ends relative to each respective trench 25a. An example masking material 90 is photoresist.

Referring to FIG. 26, the interconnected portions of the material of the first and second etch masks 86, 88 are etched, followed by subsequent etching of conductive material 34a/35a. Masking material 90 (not shown) has been subsequently removed. Alternately, some or all of such might remain depending in part upon its composition. One or more suitable etching chemistries may be selected by the artisan for etching of the masking material of masks 86, 88 followed by conductive material 34a/35a. One or a combination of dry and wet etching may be used. In one embodiment, at least a majority of each of the first and second etch masks remain as part of the finished integrated circuitry. For example, where the material of first and second etch masks 86 and 88 is insulative, such may largely remain, for example in the embodiment depicted by FIG. 26.

In one embodiment, a method of forming a pair of conductive lines in the fabrication of integrated circuitry includes formation of a trench into a damascene material which is received over a substrate. Conductive material is deposited over the damascene material and to within the trench to overfill the trench. The conductive material is removed back at least to the damascene material to leave at least some of the conductive material remaining in the trench. Longitudinal etching is conducted through the conductive material within the trench to form first and second conductive lines within the trench which are mirror images of one another in lateral cross section along at least a majority of length of the first and second conductive lines. Processing as shown and described above are but some examples of such a method.

One embodiment of the invention encompasses a method of forming an array of conductive lines in the fabrication of integrated circuitry. Such includes formation of a plurality of elongated conductive lines over a substrate. Processing may be conducted, for example, as shown and described above. Alternately by way of example only, such plurality of elongated conductive lines might be fabricated solely using subtractive patterning and etching techniques, as well as using other techniques whether existing or yet-to-be developed. Combinations of different techniques may also be used.

First and second alternating regions of dielectric material are provided between the conductive lines laterally across the array. The first regions comprise a singular void received within solid insulative material between two immediately adjacent of the conductive lines. The second regions are at least in part characterized by an absence of any void space within solid insulative material between two immediately adjacent conductive lines. By way of example only, the above-described processings in production of the FIG. 17 array of conductive lines are but examples. Such depicts example first regions 80 as being characterized by a combination of dielectric material 70 and void space 72 received between conductive lines 52 and 56. Conductive lines 52 and 56 may or may not be mirror images of one another, and may otherwise be different or the same as one another. First regions 80 alternate with second regions 82 that are characterized by an absence of any void space within solid material 24 received between the respective pairs of conductive lines 52 and 56. Regardless, the first and second regions may be fabricated at the same or different times. The above-described embodiment shows a method wherein first regions 80 having a void 72 are formed after forming second regions 82 which do not have any void space. Regardless, processing may otherwise be conducted as described above or otherwise.

Embodiments of the invention also encompass integrated circuitry comprising an array of conductive lines and independent of method of fabrication. In one embodiment, such circuitry and array includes a plurality of elongated conductive lines received over a substrate. First and second alternating regions of dielectric material are received between the conductive lines laterally across the array. The first regions comprise a singular void received within solid insulative material between two immediately adjacent of the conductive lines. The second regions are at least in part characterized by an absence of any void space within solid insulative material between two immediately adjacent of the conductive lines. Again by way of example only, FIG. 17 shows such example circuitry having an array of conductive lines.

In one embodiment, integrated circuitry comprising an array of conductive lines includes a plurality of elongated conductive lines received over a substrate. The conductive lines are at least in part characterized by repeating pairs of immediately adjacent conductive lines which are mirror images of one another in lateral cross section along at least a majority of length of the repeating pairs. Conductive lines 52 and 56 as shown and described above are but examples of immediately adjacent conductive lines which are mirror image of one another.

Dielectric material is received between the conductive lines over the substrate laterally across the array. Such may or may not comprise first and second alternating regions received between the conductive lines laterally across the array with and without a singular void as described above.

Further and regardless, the above described and depicted mirror image lines 52 and 56 may advantageously provide greater conductivity due to being lined on only one side with material 34. For example, a layer 34 may be provided to function as a diffusion barrier and/or adhesion layer relative to underlying material. Such may be desired where, for example, material 35 deposited thereover is lacking in diffusion barrier and/or adhesion properties relative to underlying or surrounding material. In such instance(s), the diffusion barrier/adhesion material may be of lower electrical conductivity than the conductive material deposited thereover. Providing the depicted mirror image lines having only one side largely composed of the lower conductive material may increase overall conductivity of the conductive lines being formed.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising an array of conductive lines, comprising:
   a plurality of elongated conductive lines over a substrate; and
   first and second different regions of dielectric material laterally between two immediately adjacent of the conductive lines laterally across the array, the first and second regions alternating relative one another laterally across the array, the dielectric material in individual of the first and second regions laterally spanning completely from conductive material of one of their respective two immediately adjacent conductive lines to conductive material of the other of their respective two immediately adjacent conductive lines laterally across the array in a lateral cross section, the first and second regions individually encompassing all dielectric material that is laterally between their respective two immediately adjacent conductive lines in the lateral cross section, all of the dielectric material of the first regions individually comprising a singular void within solid dielectric material between their respective two immediately adjacent conductive lines, all of the dielectric material of the second regions individually being at least in part characterized by an absence of any void space within solid dielectric material between their respective two immediately adjacent conductive lines.

2. The integrated circuitry of claim 1 wherein the respective lines have a minimum width of no greater than 20 nanometers.

3. The integrated circuitry of claim 1 wherein minimum space between immediately adjacent of the respective lines is no greater than 20 nanometers.

4. The integrated circuitry of claim 1 wherein the respective lines have a minimum width of no greater than 20 nanometers, and wherein minimum space between immediately adjacent of the respective lines is no greater than 20 nanometers.

5. The integrated circuitry of claim 1 wherein the solid dielectric material is homogenous.

6. The integrated circuitry of claim 1 wherein the solid dielectric material is non-homogenous.

7. The integrated circuitry of claim 1 wherein the singular void in the first regions is laterally centered between conductive material of each of their respective two immediately adjacent conductive lines.

8. The integrated circuitry of claim 1 wherein the singular void in the first regions is not laterally centered between conductive material of each of their respective two immediately adjacent conductive lines.

9. Integrated circuitry comprising an array of conductive lines, comprising:
   a plurality of elongated conductive lines over a substrate, the conductive lines being at least in part characterized by repeating pairs of immediately adjacent conductive lines; the respective conductive lines of individual of the pairs individually comprising a first conductive sidewall surface, a second conductive sidewall surface, and a conductive base surface extending between the first and second conductive sidewall surfaces the second conductive sidewall surfaces in the individual pairs facing toward one another; the first conductive sidewall surfaces in the individual pairs facing away from one another; the base surfaces and the first sidewall surfaces being of a first conductive composition; lower portions of the second sidewall surfaces comprising the first conductive composition; upper portions of the second sidewall surfaces comprising a second conductive composition which is different from the first conductive composition; the individual lines within individual of the repeating pairs being mirror images of one another in lateral cross section along at least a majority of length of the repeating pairs; and
   dielectric material between the conductive lines over the substrate laterally across the array.

10. The integrated circuitry of claim 9 wherein the first composition is of lower electrical conductivity than the second composition.

11. The integrated circuitry of claim 9 wherein the respective conductive lines comprise greater volume of the second composition than of the first composition.

12. The integrated circuitry of claim 11 wherein the first composition is of lower electrical conductivity than the second composition.

13. The integrated circuitry of claim 9 wherein the dielectric material comprises:
   first and second different regions laterally between two immediately adjacent of the conductive lines laterally across the array, the first and second regions alternating relative one another laterally across the array, the first regions being laterally between individual lines within the individual pairs, the second regions being laterally between immediately adjacent of the pairs of immediately adjacent conductive lines, the dielectric material in individual of the first and second regions laterally spanning completely from conductive material of one of their respective two immediately adjacent conductive lines to conductive material of the other of their respective two immediately adjacent conductive lines laterally across the array in a lateral cross section, the first and second regions individually encompassing all dielectric material that is laterally between their respective two immediately adjacent conductive lines in the lateral cross section, all of the dielectric material of the first regions individually comprising a singular void within solid dielectric material between their respective two immediately adjacent conductive lines, all of the dielectric material of the second regions individually being at least in part characterized by an absence of any void space within solid dielectric material between their respective two immediately adjacent conductive lines.

* * * * *

UNITED STATES PATENT AND TRADEMARK OFFICE
CERTIFICATE OF CORRECTION

| | | |
|---|---|---|
| PATENT NO. | : 9,064,935 B2 | Page 1 of 1 |
| APPLICATION NO. | : 13/182293 | |
| DATED | : June 23, 2015 | |
| INVENTOR(S) | : Tang et al. | |

It is certified that error appears in the above-identified patent and that said Letters Patent is hereby corrected as shown below:

In the claims

Col. 12, line 39, claim 9, delete "surfaces the" after "sidewall" and insert --surfaces; the--.

Signed and Sealed this
Twentieth Day of October, 2015

Michelle K. Lee
*Director of the United States Patent and Trademark Office*